(12) United States Patent
Wall et al.

(10) Patent No.: US 12,535,735 B2
(45) Date of Patent: Jan. 27, 2026

(54) MODIFIED THIOXANTHONE PHOTOINITIATORS

(71) Applicants: LINTFIELD LIMITED, Tonbridge (GB); TOKYO ELECTRON LIMITED, Tokyo (JP)

(72) Inventors: Christopher Wall, Tonbridge (GB); Cong-Que Dinh, Tokyo (JP); Seiji Nagahara, Tokyo (JP)

(73) Assignees: Lintfield Limited, Kent (GB); Tokyo Electron Limited, Tokyo (JP)

( * ) Notice: Subject to any disclaimer, the term of this patent is extended or adjusted under 35 U.S.C. 154(b) by 863 days.

(21) Appl. No.: 17/791,834

(22) PCT Filed: Jan. 15, 2021

(86) PCT No.: PCT/GB2021/050091
§ 371 (c)(1),
(2) Date: Jul. 8, 2022

(87) PCT Pub. No.: WO2021/144582
PCT Pub. Date: Jul. 22, 2021

(65) Prior Publication Data
US 2023/0082557 A1    Mar. 16, 2023

(30) Foreign Application Priority Data
Jan. 17, 2020  (GB) ..................... 2000736

(51) Int. Cl.
| | | |
|---|---|---|
| G03F 7/039 | (2006.01) | |
| C07D 335/16 | (2006.01) | |
| C07D 495/10 | (2006.01) | |
| C07D 519/00 | (2006.01) | |
| G03F 7/038 | (2006.01) | |

(52) U.S. Cl.
CPC ......... *G03F 7/0392* (2013.01); *C07D 335/16* (2013.01); *C07D 495/10* (2013.01); *C07D 519/00* (2013.01); *G03F 7/038* (2013.01)

(58) Field of Classification Search
CPC ............... G03F 7/0392; C07D 335/16
See application file for complete search history.

(56) References Cited

U.S. PATENT DOCUMENTS

| | | | |
|---|---|---|---|
| 4,491,628 A | 1/1985 | Ito et al. | |
| 6,025,408 A | 2/2000 | Williams et al. | |
| 6,136,499 A | 10/2000 | Goodall et al. | |
| 7,425,585 B2 | 9/2008 | Kura et al. | |
| 7,585,611 B2 | 9/2009 | Kato et al. | |
| 7,858,287 B2 | 12/2010 | Watanabe et al. | |
| 8,614,047 B2 | 12/2013 | Ayothi et al. | |
| 9,529,259 B2 | 12/2016 | Namai | |
| 2004/0014833 A1 | 1/2004 | Bradley | |
| 2010/0267775 A1 | 10/2010 | Negoro et al. | |
| 2015/0241783 A1 | 8/2015 | Carcasi et al. | |
| 2016/0327869 A1 | 11/2016 | Nagahara et al. | |
| 2016/0357103 A1 | 12/2016 | Nagahara et al. | |
| 2017/0052448 A1 | 2/2017 | Nakagawa et al. | |
| 2017/0052449 A1 | 2/2017 | Nakagawa et al. | |

FOREIGN PATENT DOCUMENTS

| | | |
|---|---|---|
| CN | 1314903 A | 9/2001 |
| CN | 102803304 A | 11/2012 |
| EP | 2 792 694 A1 | 10/2014 |
| EP | 3 133 444 A1 | 2/2017 |
| JP | 2019-168475 A | 10/2019 |
| WO | 2009/054423 A1 | 4/2009 |
| WO | 2011/086389 A1 | 7/2011 |
| WO | 2018/030445 A1 | 2/2018 |
| WO | 2020/016389 A1 | 1/2020 |

OTHER PUBLICATIONS

Reese, C.B.; Yan, H. "Xanthen-9-ylidene protecting groups in glycerol chemistry" J. Chem. Soc., Perkin Trans. 1, 2001, 1807-1815 (Year: 2001).*
S. Tagawa, S. Enomoto, A. Oshima; Super High Sensitivity Enhancement by Photo-Sensitized Chemically Amplified Resist (PS-CAR) Process; Journal of Photopolymer Science and Technology; vol. 26, No. 6 (2013) 835-830.
High-resist sensitisation by pattern and flood combination lithography, Tagawa et al., Proc. SPIE, 9048, 90481S (2014).
Selective Reductions. XIX. The Rapid Reaction of Carboxylic Acids with Borane-Tetrahydrofuran. Nung Min Yoon and Chwang Siek Pak, J.Org. Chem., vol. 38, No. 16, 1973.
First Office Action issued in corresponding Chinese Patent Application No. 202180009441.6, Oct. 8, 2023.
Photosensitised Chemically Amplified ResistTM (PSCARTM) 2.0 for high throughput and high resolution EUV lithography: Dual photosensitisation of acid generation and quencher decomposition by flood exposure, S. Tagawa et al., Proc. of SPIE vol. 10146, Advances in Patterning Materials and Processes XXXIV, 101460G (2017).

(Continued)

*Primary Examiner* — Andrew D Kosar
*Assistant Examiner* — John D Mcanany
(74) *Attorney, Agent, or Firm* — Melissa M. Hayworth; E. Joseph Gess; Merchant & Gould, P.C.

(57) ABSTRACT

Latent photoinitiator compounds are described, as well as compositions containing such compounds and their uses in photoinitiated methods for producing photoresist structured.

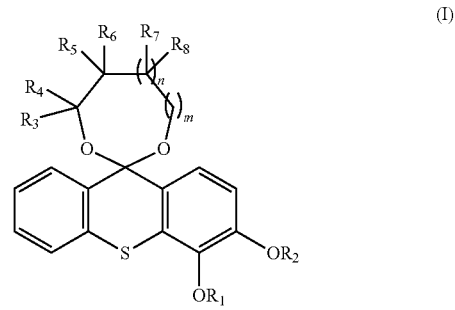

32 Claims, No Drawings

(56) References Cited

OTHER PUBLICATIONS

Introduction to Microlithography, (2nd edition) ISBN 0-8412-2848-5 pp. 223-227 and Figure 85.
International Search Report and Written Opinion issued in corresponding International Patent Application No. PCT/GB2021/050091, Mar. 9, 2021.
Office Action issued in corresponding Japanese Patent Application No. 2022-543121, Oct. 29, 2024.
Office Action issued in corresponding Taiwan Patent Application No. 110101736, Aug. 30, 2024.

* cited by examiner

MODIFIED THIOXANTHONE PHOTOINITIATORS

RELATED APPLICATIONS

The present application is a U.S. National Stage filing under 35 U.S.C. § 371 of International Application No. PCT/GB2021/050091 filed 15 Jan. 2021, which claims priority to GB Application No. 2000736.5 filed 17 Jan. 2020.

FIELD OF THE INVENTION

The present invention relates to substituted thioxanthone derivatives in which the carbonyl group is blocked by a cyclic ketal, or a substituted or an unsubstituted 1,3-dioxolane, or a substituted or an unsubstituted 1,3-dioxane group, or a substituted or an unsubstituted 1,3-dioxepane group, or a substituted or an unsubstituted 1,3-dioxocane group, or a substituted or an unsubstituted 1,3-dioxonane group, and dimers thereof, and to the use of such derivatives in photoinitiated reactions. The invention also relates to synthetic methods of making these and other substituted thioxanthone derivatives.

BACKGROUND OF THE INVENTION

Light absorbing ketone compounds are well known for use in photoinduced reactions. These species are commonly referred to as photoinitiators or photosensitisers and create reactive species when exposed to radiation. Examples of such photoinitiators or photosensitisers can be found in U.S. Pat. No. 7,585,611 B, EP 2,792,694 A1 and U.S. Pat. No. 7,425,585 B. When incorporated in a suitable transformable substrate, the reactive species generated by exposure to radiation, optionally in combination with other species, is capable of directly or indirectly, via a sensitisation and energy or electron transfer process, causing a chemical reaction in the transformable substrate. Typically, transformable substrates contain an organic material, which may be a monomer, oligomer, polymer, or mixture thereof, which is transformed to a new polymeric material.

In some applications, it is desirable to block the ketone moiety or moieties of ketone photoinitiators so that the photoinitiator is latent, and can be activated by deblocking. US 2004/0014833 and WO 2011/086389 relate to such protected ketone photoinitiators, and methods of using them.

The present invention is concerned with blocked or latent ketone photoinitiators which are improved over those known in the art. In particular, the blocked or latent ketone photoinitiators of the present invention having particular substituents on the cyclic ketal and particular substituents and/or protecting groups on the carbon skeleton of the thioxanthone have been found to have properties which make them desirable in a variety of applications. These properties include an increased solubility difference of at least the deprotected species in an aqueous or organic developing media, compared to the unsubstituted photoinitiators.

Unless otherwise stated, references herein to a "blocked" ketone photoinitiator are to a latent ketone photoinitiator in which the ketone group has been blocked through reaction of the ketone with a diol to form a 1,3-dioxolane group, a 1,3 dioxane group, a 1,3-dioxepane group, a 1,3-dioxocane group or a 1,3-dioxonane group, or the ketone group has been blocked through reaction of the ketone with a tetraol to form a dimer, wherein two photoinitiator molecules are joined such that each ketone forms a 1,3-dioxolane group, a 1,3 dioxane group, a 1,3-dioxepane group, a 1,3-dioxocane group or a 1,3-dioxonane group, respectively, with a linker between the two ketal moieties or with the two ketal moieties fused to one another along a carbon-carbon bond. References herein to a "blocked" ketone photoinitiator are also to latent ketone photoinitiator dimers in which the ketone group of each monomer has been blocked through reaction of the ketone with a substituted diol to form a substituted 1,3-dioxolane group, a substituted 1,3 dioxane group, a substituted 1,3-dioxepane group, a substituted 1,3-dioxocane group or a 1,3-dioxonane group, in which the substituent on the diol is a reactive substituent capable of reacting with itself so as to form a dimer. Consequentially, references herein to an "unblocked" or "deblocked" ketone photoinitiator are to the active ketone photoinitiator monomers with the carbonyl present in place of the 1,3-dioxolane group, or 1,3-dioxane group, or 1,3-dioxepane group, or 1,3-dioxocane group, or 1,3-dioxonane group. Unless otherwise stated, references herein to a "protected" ketone photoinitiator are to a compound having functional groups present on the aromatic ring of the photoinitiator, which functional groups have been modified by inclusion of a protecting group. For example, acetal, alkylcarbonate and ester substituents are protecting groups for an underlying hydroxyl group and so a compound having one of these protecting groups as a substituent may be referred to as a protected ketone photoinitiator.

One particular application of blocked ketone photoinitiators to which the compounds of the present invention are suited is use as components of photoresist compositions. Photoresists are light-sensitive compositions used in many industrial processes and have particularly important applications in the electronics industry. Typically, photoresist compositions are coated on a substrate to form a photoresist layer. Selected regions of the layer are then exposed to electromagnetic energy, usually light energy, such as UV, deep UV, KrF or ArF excimer laser light, EUV light, or electron beam (EB) in order to initiate chemical reactions in the exposed regions of the photoresist. A photoresist developer is then used to remove material which is soluble in the developer. Photoresists can be in the form of negative photoresists or positive photoresists. A positive photoresist is a photoresist in which the exposed portion of the photoresist becomes soluble to the photoresist developer and can thus be removed by the developer, while the unexposed portion of the photoresist remains insoluble to the photoresist developer. A negative photoresist is one in which the exposed portion of the photoresist becomes insoluble to the photoresist developer while the unexposed portion of the photoresist is dissolved and can be removed by the photoresist developer. After the step using the developer, a patterned coating which is insoluble in the developer remains on the surface. Further steps may be carried out to harden the coating, such as a curing step which may be performed by the application of heat or further exposure to light.

Where features in the soluble parts of the photoresist which are to be removed by the developer are very fine, which is commonly the case for positive photoresists, it is important that the species present in the regions to be removed are soluble in the developer medium, which is typically an aqueous medium. Otherwise, so-called "scumming" can result. The latent, or blocked, photoinitiators described herein, may advantageously be used in such photoinitiated methods.

SUMMARY OF THE INVENTION

According to the present invention there is provided a compound of the formula I:

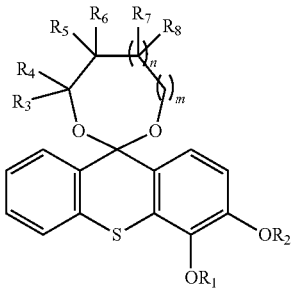

(I)

wherein n=0 or 1, m=0, 1, 2 or 3, $R_1$ and $R_2$ are independently selected from a $C_{1-6}$ alkylhydroxy group or a carboxylate ester thereof, a $C_{1-6}$ alkylthio group and a $C_{1-6}$ alkylamino group, a $C_{1-6}$ carboxylate ester group wherein the ester portion comprises a $C_{1-6}$ alkyl group and/or a 4- to 10-membered carbocyclic group; and $R_3$, $R_4$, $R_5$, $R_6$, $R_7$ and $R_8$ are independently selected from H, a hydroxy group, a $C_{1-6}$ alkyl group, a $C_{2-6}$ alkenyl group, a $C_{1-6}$ alkoxy group, a $C_{1-6}$ alkylthio group, a 4- to 8-membered carbocyclic group, a 4- to 8-membered heterocyclic group, a $C_{1-6}$ carboxylate ester group wherein the ester portion comprises a $C_{1-6}$ alkyl group and/or a 4- to 10-membered carbocyclic group, or wherein $R_5$ forms with $R_3$ or $R_7$ a 4- to 8-membered carbocyclic group or a 4- to 8-membered heterocyclic group.

In some embodiments, $R_3$, $R_4$, $R_5$, $R_6$, $R_7$ and $R_8$ are independently selected from a $C_{1-6}$ alkyl group, a $C_{2-6}$ alkenyl group, a $C_{1-6}$ alkoxy group, a $C_{1-6}$ alkylthio group, a 4- to 8-membered carbocyclic group, a 4- to 8-membered heterocyclic group, a $C_{1-6}$ carboxylate ester group wherein the ester portion comprises a $C_{1-6}$ alkyl group and/or a 4- to 10-membered carbocyclic group, or wherein $R_5$ forms with $R_3$ or $R_7$ a 4- to 8-membered carbocyclic group or a 4- to 8-membered heterocyclic group, wherein the selected group is optionally further substituted with one or more substituent selected from: halogen, hydroxyl, mercapto, nitro, cyano, formyl, carboxyl, trifluoromethyl, trifluoromethoxy, amino, oxo, imino, $C_{1-6}$ alkyl (for example methyl), $C_{1-6}$ alkoxy (for example, methoxy), heteroaryl, phenyl, or phenyl or heteroaryl substituted by one or more of halogen, hydroxyl, mercapto, nitro, cyano, formyl, carboxyl, trifluoromethyl, trifluoromethoxy, amino, oxo, imino, $C_{1-6}$ alkyl (for example methyl) or $C_{1-6}$ alkoxy (for example, methoxy).

In some embodiments, the 1,3-dioxolane ring, the 1,3-dioxane ring, the 1,3-dioxepane ring, the 1,3-dioxocane ring or the 1,3-dioxonane ring may be unsubstituted. In some embodiments, $R_3$, $R_4$, $R_5$, $R_6$, $R_7$ and $R_8$ may be selected such that the 1,3-dioxolane ring, the 1,3-dioxane ring, the 1,3-dioxepane ring, the 1,3-dioxocane ring or the 1,3-dioxonane ring is substituted with one or more substituent. In some embodiments, $R_3$, $R_4$, $R_5$, $R_6$, $R_7$ and $R_8$ may be selected such that the 1,3-dioxolane ring, the 1,3-dioxane ring, the 1,3-dioxepane ring, the 1,3-dioxocane ring or the 1,3-dioxonane ring is substituted with two or more substituents in any substitution pattern, for example geminal, vicinal or other.

Thus, in some examples, one or more of $R_3$, $R_4$, $R_5$, $R_6$, $R_7$ and $R_8$ may independently be (chloro)alkyl, which comprises $C_{1-6}$ (chloro)alkyl, for example (chloro)methyl, (chloro)ethyl, (chloro)propyl, and also comprises (chloro)cycloalkyl in which two substituents on the for example 1,3-dioxane ring may be joined to form a cyclic group, for example a 5- or 6-membered carbocycle fused to the 1,3-dioxane ring. In some examples, the 1,3-dioxolane ring, the 1,3-dioxane ring, the 1,3-dioxepane ring, the 1,3-dioxocane ring or the 1,3-dioxonane ring may be substituted with one or more $C_{1-6}$ alkyl groups, for example two or more $C_{1-6}$ alkyl groups in any substitution pattern. For example, the 1,3-dioxolane ring, the 1,3-dioxane ring, the 1,3-dioxepane ring, the 1,3-dioxocane ring or the 1,3-dioxonane ring may be substituted with geminal or vicinal $C_{1-6}$ alkyl groups, for example geminal or vicinal methyl groups. In some examples, the 1,3-dioxolane ring, the 1,3-dioxane ring, the 1,3-dioxepane ring, the 1,3-dioxocane ring or the 1,3-dioxonane ring may be substituted with one, two, three or four $C_{1-6}$ alkyl groups, for example one, two, three or four methyl groups. It will be understood that in all of the above mentioned examples, $C_{1-6}$ alkyl comprises methyl, ethyl, propyl, butyl, pentyl and hexyl, and all regioisomers thereof.

In some examples, the compounds of the present invention are other than those of formula I and can be based on the same thioxanthone ketone photoinitiator with the ketone blocked by a cyclic ketal connected to another cyclic ketal-blocked thioxanthone ketone photoinitiator by a linker group, for example, compounds in which the ketone is "blocked" by a 6-membered cyclic acetal, for example 1,3-dioxane, connected to another thioxanthone ketone photoinitiator by a linker, for example an ethylene bridge or a vinyl bridge, to the other ketone which is also "blocked" by a 6-membered cyclic acetal, for example 1,3-dioxane. In some examples, such compounds may be described as being dimers of a compound of Formula I, for example compounds of formula II:

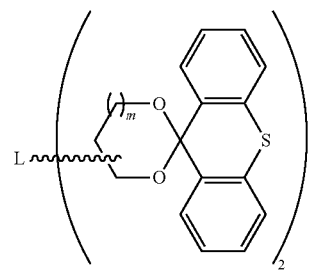

(II)

in which m=0, 1, 2, 3 or 4,
one of the aromatic rings is 3,4-di-substituted with substituents independently selected from —O—$C_{(1-6)}$alkylhydroxy group or a carboxylate ester thereof, a —O—$C_{(1-6)}$alkylthio group and a —O—$C_{(1-6)}$alkylamino group, a —O—$C_{(1-6)}$carboxylate ester group wherein the ester portion comprises a $C_{1-6}$ alkyl group and/or a 4- to 10-membered carbocyclic group; or
one or both of the aromatic rings is substituted with at least one substituent independently selected from hydroxy, alkoxy, benzyloxy, alkylcarbonate, hydroxyalkyl, acetal, ester, oxyacetic acid and esters thereof, aryloxy and arylthio;
and L=a linker group.

In some embodiments, L=a single bond, —$C_{1-6}$alkyl- or $C_{2-6}$-alkenyl or a phenyl ring, which may be substituted. In some examples, L=a carbon-carbon bond fusing the two monomers together so as to share a common carbon-carbon bond between the respective 1,3-dioxolane groups, 1,3 dioxane groups, 1,3-dioxepane groups, 1,3-dioxocane groups or 1,3-dioxonane groups. In some examples, L=a phenyl ring fused to each monomer so as to share a common carbon-carbon bond with each of the respective 1,3-dioxolane groups, 1,3 dioxane groups, 1,3-dioxepane groups, 1,3-dioxocane groups or 1,3-dioxonane groups. In some examples, L=a phenyl ring forming a new carbon-carbon bond to each of the respective 1,3-dioxolane groups, 1,3 dioxane groups, 1,3-dioxepane groups, 1,3-dioxocane groups or 1,3-dioxonane groups. In some examples, L=a carbon atom common to the 1,3-dioxolane groups, 1,3 dioxane groups, 1,3-dioxepane groups, 1,3-dioxocane groups or 1,3-dioxonane groups of each monomer so as form a spiro centre.

Thus, in some examples, L is selected from the group consisting of a single bond, a $C_{1-6}$ alkyl group, a $C_{2-6}$ alkenyl group, or a 4- to 8-membered carbocyclic group, each of which may be substituted, or wherein L comprises a fused carbon-carbon bond shared between the respective 1,3-dioxolane groups, 1,3 dioxane groups, 1,3-dioxepane groups, 1,3-dioxocane groups or 1,3-dioxonane groups, or wherein L comprises a carbon atom shared between the respective 1,3-dioxolane groups, 1,3 dioxane groups, 1,3-dioxepane groups, 1,3-dioxocane groups or 1,3-dioxonane groups.

Unless otherwise stated, where stereocentres exist in any of the compounds described or claimed herein, the compounds are present in racemic form.

In an embodiment, one of the aromatic rings is substituted with at least one (e.g. one, two, three or four) substituents independently selected from hydroxy, alkoxy, benzyloxy, alkylcarbonate, hydroxyalkyl, acetal, ester, oxyacetic acid and esters thereof, aryloxy and arylthio and the other aromatic ring is unsubstituted. In another embodiment, each of the aromatic rings is substituted with at least one substituent independently selected from hydroxy, alkoxy, benzyloxy, alkylcarbonate, hydroxyalkyl, acetal, ester, oxyacetic acid and esters thereof, aryloxy and arylthio. In this embodiment, each of the rings is substituted with a single substituent independently selected from hydroxy, alkoxy, benzyloxy, alkylcarbonate, hydroxyalkyl, acetal, ester, oxyacetic acid and esters thereof, aryloxy and arylthio, or one of the rings is substituted with two substituents independently selected from hydroxy, alkoxy, benzyloxy, alkylcarbonate, hydroxyalkyl, acetal, ester, oxyacetic acid and esters thereof, aryloxy and arylthio, and the other one of the rings is substituted with a single substituent selected from hydroxy, alkoxy, benzyloxy, alkylcarbonate, hydroxyalkyl, acetal, ester, oxyacetic acid and esters thereof, aryloxy and arylthio or one of the rings is substituted with three substituents independently selected from hydroxy, alkoxy, benzyloxy, alkylcarbonate, hydroxyalkyl, acetal, ester, oxyacetic acid and esters thereof, aryloxy and arylthio, and the other one of the rings is substituted with a single substituent selected from hydroxy, alkoxy, benzyloxy, alkylcarbonate, hydroxyalkyl, acetal, ester, oxyacetic acid and esters thereof, aryloxy and arylthio or one of the rings is substituted with four substituents independently selected from hydroxy, alkoxy, benzyloxy, alkylcarbonate, hydroxyalkyl, acetal, ester, oxyacetic acid and esters thereof, aryloxy and arylthio, and the other one of the rings is substituted with a single substituent selected from hydroxy, alkoxy, benzyloxy, alkylcarbonate, hydroxyalkyl, acetal, ester, oxyacetic acid and esters thereof, aryloxy and arylthio.

In other embodiments, each of the aromatic rings is substituted with at least two substituents, for example at least three substituents, for example four substituents, each independently selected from hydroxy, alkoxy, benzyloxy, alkylcarbonate, hydroxyalkyl, acetal, ester, oxyacetic acid and esters thereof, aryloxy and arylthio.

The invention also provides a composition comprising:
(a) a compound of formula I or II as defined above; and
(b) a chemically transformable substrate;
wherein the compound of formula I or II is a precursor of a reactive derivative of formula III:

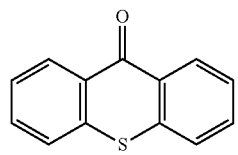

(III)

the compound of formula III having the same substitution pattern as the compound of formula I or II and being obtainable by reacting the compound of formula I or II in the presence of an acid;
and further wherein the transformable substrate is capable of being transformed in the presence of the compound of formula III by a direct photoinitiated reaction or an indirect photoinitiated reaction.

In some examples, the compound of formula III having the same substitution pattern as the compound of formula I or II is obtainable by reacting the compound of formula I or II in the presence of an acid with heat treatment.

By "reactive derivative" it is meant that the acid treatment, with or without heat, cleaves the ketal, e.g. a cyclic ketal such as the 1,3-dioxolane, or the 1,3-dioxane, or the 1,3-dioxepane, or the 1,3-dioxocane, or the 1,3-dioxonane moiety to make available the carbonyl group which provides the reactive functionality in a photoinitiated method as described below.

The composition of the invention may be used in a photoinitiated method which comprises:
(a) forming a layer of the composition on a support;
(b) applying an acid, or generating an acid in situ, in selected regions of the layer and permitting the acid to react with the compound of formula I or II and form the reactive derivative of formula III in said selected regions of the layer;
(c) exposing the layer with the reactive derivative present in said selected regions to electromagnetic radiation of a wavelength or energy suitable to generate a reactive species from the compound of formula III; and
(d) permitting the reactive species directly or indirectly to cause transformation of the transformable substrate.

In some embodiments, permitting the acid to react with the compound of formula I or II and form the reactive derivative of formula III may comprise application of heat. The application of heat may be simultaneous with the applying of an acid or generating an acid in situ, or it may be subsequent to this step.

In some embodiments, the method may further comprise performing a post-transformation heat treatment.

The temperature of either one or both of these heat treatments may be in the range of from 70° C. to 170° C. The duration of either one or both of these heat treatment may be in the range of from 2 min to 120 min. It will be understood that the temperatures and times are provided merely by way of example and should not be considered in any way limiting.

In some embodiments, the reactive derivative of formula III comprises a compound of formula IIIa:

(IIIa)

in which $R_1$ and $R_2$ are independently selected from a $C_{1-6}$ alkylhydroxy group, a $C_{1-6}$ alkylthio group and a $C_{1-6}$ alkylamino group, a $C_{1-6}$ carboxylic acid group.

In some embodiments, the reactive derivative of formula III comprises a compound of formula III in which one or both of the aromatic rings is substituted with at least one substituent independently selected from hydroxy, alkoxy, benzyloxy, alkylcarbonate, hydroxyalkyl, acetal, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, benzyloxy, hydroxyalkyl, acetal, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, acetal, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, benzyloxy, alkylcarbonate, hydroxyalkyl, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, benzyloxy, alkylcarbonate, hydroxyalkyl, acetal, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, benzyloxy, alkylcarbonate, hydroxyalkyl, acetal, ester, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, benzyloxy, alkylcarbonate, hydroxyalkyl, acetal, ester, aryloxy and arylthio.

In some embodiments, the reactive derivative of formula III comprises a compound of formula III in which one or both of the aromatic rings is substituted with at least one substituent independently selected from hydroxy, alkoxy, benzyloxy, hydroxyalkyl, acetal, ester, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, benzyloxy, hydroxyalkyl, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, benzyloxy, alkylcarbonate, hydroxyalkyl, ester, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, benzyloxy, alkylcarbonate, hydroxyalkyl, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, acetal, ester, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, acetal, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, acetal, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, benzyloxy, hydroxyalkyl, acetal, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, benzyloxy, alkylcarbonate, hydroxyalkyl, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, benzyloxy, hydroxyalkyl, acetal, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, benzyloxy, hydroxyalkyl, ester, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, benzyloxy, hydroxyalkyl, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, acetal, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, ester, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, acetal, ester, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, acetal, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, benzyloxy, hydroxyalkyl, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, acetal, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, ester, oxyacetic acid, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, alkylcarbonate, hydroxyalkyl, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, acetal, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, ester, oxyacetic acid and esters thereof, aryloxy and arylthio.

In some embodiments, the reactive derivative of formula III comprises a compound of formula III in which one or both of the aromatic rings is substituted with at least one substituent independently selected from hydroxy, alkoxy, hydroxyalkyl, oxyacetic acid, aryloxy and arylthio.

For the avoidance of doubt, references in the preceding paragraphs to "one or both of the aromatic rings substituted with at least one substituent independently selected from . . . " are to situations in which each of the aromatic rings is singly substituted, or doubly substituted, or triply substituted, or quadruply substituted with each substituent being independently selected from any list provided herein. It will be understood that the same reference applies equally to situations in which one ring has a single substituent and the other has two, three or four substituents, or situations in which one ring has two substituents and the other has three or four substituents, or situations in which one ring has three substituents and the other has four substituents, with the substituents in all cases being independently selected from any list provided herein.

In some embodiments of the invention, compounds of the invention, have good solubility in an aqueous medium which makes them suitable for use in photoinitiated methods in which the compounds will remain after transformation of the chemically transformable substrate, and have to be removed by means of an aqueous developer solution.

In another embodiment, the compounds of the invention have much better solubility in aqueous media, after deprotection, which makes them suitable for use in photoinitiated methods in which the compounds themselves, and in particular the deprotected forms thereof, will remain after transformation of the chemically transformable substrate, and have to be removed by means of an aqueous developer solution resulting in an improved contrast and better image quality after development.

DETAILED DESCRIPTION OF THE INVENTION

Compounds of the Invention

In a first aspect, the present invention provides compounds of the formula I:

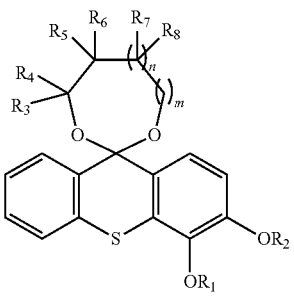

(I)

wherein n=0 or 1, m=0, 1, 2 or 3, $R_1$ and $R_2$ are independently selected from a $C_{1-6}$ alkylhydroxy group, a $C_{1-6}$ alkylthio group and a $C_{1-6}$ alkylamino group and $R_3$, $R_4$, $R_5$, $R_6$, $R_7$ and $R_8$ are independently selected from H, a hydroxy group, a $C_{1-6}$ alkyl group, a $C_{1-6}$ alkoxy group, a $C_{1-6}$ alkylthio group, a 4- to 8-membered carbocyclic group, a 4 to 8-membered heterocyclic group, or wherein $R_5$ forms with $R_3$ or $R_7$ a 4- to 8-membered carbocyclic group or a 4- to 8-membered heterocyclic group.

The present invention also provides compounds of formula II:

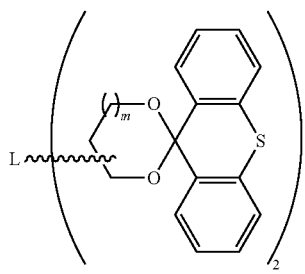

(II)

in which m=0, 1, 2, 3 or 4, one of the aromatic rings is di-substituted, at the 3 and 4 positions of the thioxanthone ring, with substituents independently selected from —O—$C_{(1-6)}$alkylhydroxy group or a carboxylate ester thereof, a —O—$C_{(1-6)}$alkylthio group and a —O—$C_{(1-6)}$alkylamino group, a —O—$C_{(1-6)}$carboxylate ester group wherein the ester portion comprises a $C_{1-6}$ alkyl group and/or a 4- to 10-membered carbocyclic group; or one or both of the aromatic rings is substituted with at least one substituent independently selected from hydroxy, alkoxy, benzyloxy, alkylcarbonate, hydroxyalkyl, acetal, ester, oxyacetic acid and esters thereof, aryloxy and arylthio;

and L=a linker group.

In one embodiment, one of the aromatic rings is substituted with at least one substituent independently selected from hydroxy, alkoxy, benzyloxy, alkylcarbonate, hydroxyalkyl, acetal, ester, oxyacetic acid and esters thereof, aryloxy and arylthio, and the other aromatic ring is unsubstituted. For example, the one ring may be substituted with a single substituent selected from hydroxy, alkoxy, benzyloxy, alkylcarbonate, hydroxyalkyl, acetal, ester, oxyacetic acid and esters thereof, aryloxy and arylthio, or may be substituted with two substituents independently selected from hydroxy, alkoxy, benzyloxy, alkylcarbonate, hydroxyalkyl, acetal, ester, oxyacetic acid and esters thereof, aryloxy and arylthio, or may be substituted with three substituents independently selected from hydroxy, alkoxy, benzyloxy, alkylcarbonate, hydroxyalkyl, acetal, ester, oxyacetic acid and esters thereof, aryloxy and arylthio, or may be substituted with four substituents independently selected from hydroxy, alkoxy, benzyloxy, alkylcarbonate, hydroxyalkyl, acetal, ester, oxyacetic acid and esters thereof, aryloxy and arylthio.

In another embodiment, each of the aromatic rings is substituted with at least one substituent independently selected from hydroxy, alkoxy, benzyloxy, alkylcarbonate, hydroxyalkyl, acetal, ester, oxyacetic acid and esters thereof, aryloxy and arylthio. For example, each of the rings may be substituted with a single substituent independently selected from hydroxy, alkoxy, benzyloxy, alkylcarbonate, hydroxyalkyl, acetal, ester, oxyacetic acid and esters thereof, aryloxy and arylthio, or one of the rings may be substituted with two substituents independently selected from hydroxy, alkoxy, benzyloxy, alkylcarbonate, hydroxyalkyl, acetal, ester, oxyacetic acid and esters thereof, aryloxy and arylthio, and the other one of the rings is substituted with a single substituent selected from hydroxy, alkoxy, benzyloxy, alkylcarbonate, hydroxyalkyl, acetal, ester, oxyacetic acid and esters thereof, aryloxy and arylthio, or one of the rings may be substituted with three substituents independently selected from hydroxy, alkoxy, benzyloxy, alkylcarbonate, hydroxyalkyl, acetal, ester, oxyacetic acid and esters thereof, aryloxy and arylthio, and the other one of the rings is substituted with a single substituent selected from hydroxy, alkoxy, benzyloxy, alkylcarbonate, hydroxyalkyl, acetal, ester, oxyacetic acid and esters thereof, aryloxy and arylthio or one of the rings is substituted with four substituents independently selected from hydroxy, alkoxy, benzyloxy, alkylcarbonate, hydroxyalkyl, acetal, ester, oxyacetic acid and esters thereof, aryloxy and arylthio, and the other one of the rings is substituted with a single substituent selected from hydroxy, alkoxy, benzyloxy, alkylcarbonate, hydroxyalkyl, acetal, ester, oxyacetic acid and esters thereof, aryloxy and arylthio.

In the compounds of the invention alkyl may be a $C_{1-6}$ alkyl, for example methyl or hexyl. In some examples, alkyl may be selected from methyl, ethyl, propyl, isopropyl, butyl, sec-butyl, t-butyl, pentyl, isopentyl, neopentyl, hexyl, isohexyl, neohexyl.

In the compounds of the invention alkoxy may be a $C_{1-6}$ alkoxy, for example methoxy or hexoxy. In some examples, alkoxy may be selected from methoxy, ethoxy, propoxy, isopropoxy, butoxy, sec-butoxy, t-butoxy, pentoxy, isopentoxy, neopentoxy, hexoxy, isohexoxy, neohexoxy. In some examples, the compounds of the invention have more than one methoxy substituent on the aromatic rings. In some examples, the compounds of the invention have a methoxy substituent on each aromatic ring. In some examples, the compounds on the invention have two methoxy substituents on one of the aromatic rings. In some examples, the compounds of the invention do not include any 1,3-dioxolane, 1,3-dioxane, 1,3-dioxepane, 1,3-dioxocane or 1,3-dioxonane derivatives of 2-methoxy-9H-thioxanthen-9-one, or 3,6-dimethoxy-9H-thioxanthen-9-one falling within the scope of Formula (I).

In the compounds of the invention in connection with for example $R_1$ and/or $R_2$ of Formula (I), alkylhydroxy may be a $C_{1-6}$ alkylhydroxy group, for example ethylhydroxy. Thus, in the compounds of the invention of Formula (I) in which $R_1$ and/or $R_2$ are alkylhydroxy, the substituents $OR_1$ and $OR_2$ on the thioxanthone ring will be understood to relate to a general formula of —OROH, such as may be derived from, for example, ethylene glycol. Carboxylate esters thereof will be understood to involve the addition of a carboxylic acid to the terminal hydroxy group, for example acetic acid such that it follows a general formula of —OROC(O)R'.

In the compounds of the invention alkylthio may be a $C_{1-6}$ alkylthio group, for example ethanethiol. Thus, in the compounds of the invention of Formula (I) in which $R_1$ and/or $R_2$ are alkylthio, the substituents $OR_1$ and $OR_2$ on the thioxanthone ring will be understood to relate to a general formula of —ORSH.

In the compounds of the invention alkylamino may be a $C_{1-6}$ alkylamino group, for example aminoethane. Thus, in the compounds of the invention of Formula (I) in which $R_1$ and/or $R_2$ are alkylamino, the substituents $OR_1$ and $OR_2$ on the thioxanthone ring will be understood to relate to a general formula of —ORNH$_2$.

In the compounds of the invention alkylcarbonate may be a $C_{1-6}$ alkylcarbonate, for example t-butoxycarbonate.

In the compounds of the invention ester may be a $C_{1-4}$ alkyl acid ester, for example acetic acid ester (acetate) or an ester of trifluoromethanesulphonic acid. In some examples, the ester may be an orthoester in which adjacent carbon atoms of the ring are each bonded to a respective oxygen atom and therewith form a 5- or 6-membered cyclic orthoester. The cyclic orthoester may be derived from trimethyl, triethyl or tripropyl orthoformate, for example triisopropyl orthoformate. For example in the case of trimethyl orthoformate, the resultant cyclic orthoester will be a 2-methoxybenzo[1,3]dioxole.

In the compounds of the invention acetal may be a C1-4 alkoxyalkyl group, for example methoxymethyl or ethoxyethyl. In some examples, the acetal may be a cyclic acetal in which adjacent carbon atoms of the ring are each bonded to a respective oxygen atom and therewith form a 5- or 6-membered cyclic acetal.

In the compounds of the invention benzyloxy may be a benzyloxy group comprising a substituted or unsubstituted benzyl group. The substituents may be selected from the group consisting of C1-6 alkyl for example methyl or ethyl, hydroxy, alkoxy, alkylcarbonate, acetal and ester.

In the compounds of the invention oxyacetic acid and esters thereof, may be oxyacetic acid or an ester thereof, for example an oxyacetic acid ester in which the esterifying group is selected from methyl, ethyl, n-propyl, iso-propyl, n-butyl, sec-butyl, t-butyl, isonorbonyl, 2-methyl-2-adamantyl, 3-tetrahydrofuranyl 3-oxocyclohexyl, γ-butyrolactone-3-yl, mevalonic lactone, γ-butyrolactone-2-yl, 3-methyl-γ-butyrolactone-3-yl, 2-tetrahydropyranyl, 2-tetrahydrofuranyl, 2,3-propylcarbonate-1-yl, a vinyl ether addition product such as ethoxyethyl, methoxy ethoxy ethyl or acetoxy ethoxy ethyl.

In the compounds of the invention, aryloxy may be a C5 or C6 aryloxy, for example phenoxy, which may be substituted. In the compounds of the invention, arylthio may be a C5 or C6 arylthio, for example phenylthio, which may be substituted. The substituents may be selected from the group consisting of C1-6 alkyl, for example methyl or ethyl, hydroxy, alkoxy, alkylcarbonate, acetal and ester.

In the compounds of the invention a 4- to 8-membered carbocyclic group may be an unsubstituted, (un)saturated carbocycle, for example cyclobutane/ene or cyclooctane/ene. In some examples, a 4- to 8-membered carbocyclic group may be selected from cyclopentane/ene, cyclohexane/ene and cycloheptane/ene. In some examples, a 4- to 8-membered carbocyclic group may be a substituted, (un) saturated carbocycle, for example methylcyclobutane/ene or methylcyclooctane/ene. In some examples, a 4- to 8-membered carbocyclic group may be selected from methylcyclopentane/ene, methylcyclohexane/ene and methylcycloheptane/ene. In some examples, a 4- to 8-membered carbocyclic group may be an unsubstituted aromatic carbocycle, for example benzene. In some examples, a 4- to 8-membered carbocyclic group may be a substituted, aromatic carbocycle, for example toluene. In some examples, a substituted, aromatic carbocycle may be substituted with one or more $C_{1-6}$ alkyl groups, for example two or more $C_{1-6}$ alkyl groups. For example, the substituted, aromatic carbocycle may be substituted with $C_{1-6}$ alkyl groups in any substitution pattern, for example vicinal methyl groups.

In the compounds of the invention a 4- to 10-membered carbocyclic group may be an unsubstituted, saturated carbocycle, for example adamantane. In some examples, a 4- to 10-membered carbocyclic group may be substituted, saturated carbocycle, for example methyladamantane.

In the compounds of the invention 4- to 8-membered heterocyclic group may be an unsubstituted, (un)saturated heterocycle, for example azetidine or azocane. In some examples, 4- to 8-membered heterocyclic group may be selected from pyrrolidine, piperidine, azepane, oxetane, tetrahydrofuran, tetrahydropyran, oxepane, oxocane, thietane, tetrahydrothiophene, thiane, thiepane and thiocane. In some examples, 4- to 8-membered heterocyclic group may be a substituted (un)saturated heterocycle, for example methylazetidine or methylazocane. In some examples, 4- to 8-membered heterocyclic group may be selected from methylpyrrolidine, methylpiperidine, methylazepane, methyloxetane, methyltetrahydrofuran, methyltetrahydropyran, methyloxepane, methyloxocane, methylthietane, methyltetrahydrothiophene, methylthiane, methylthiepane and methylthiocane. For the avoidance of doubt, the unsaturated equivalent molecules of the above listed 4- to 8-membered heterocyclic groups are also included. It will be further understood that unsaturated means at least one double bond, if not more. It will be further understood that this includes aromatic heterocycles, for example, pyrrole, furan and thiophene. It will be further understood that in the above mentioned examples, the terms "heterocycle" or "heterocyclic" indicate a ring molecule that may contain at least a single heteroatom, if not more, for example pyrazine and thiazole.

In some embodiments of the invention, all of the substituents on the aromatic rings may be the same.

In some embodiments of the invention, the 1,3-dioxolane ring may be substituted with one or more substituent selected from alkyl, ester, cycloalkyl, cycloalkenyl, haloalkyl, aryl, heteroaryl or vinyl in any substitution pattern as described herein. In some examples, alkyl comprises $C_{1-6}$ (chloro)alkyl, for example (chloro)methyl, (chloro)ethyl, (chloro)propyl and also comprises (chloro)cycloalkyl and aryl in which two substituents on the 1,3-dioxolane ring may be joined to form a cyclic group, for example a 5- or 6-membered carbocycle fused to the 1,3-dioxolane ring. In some examples, the 1,3-dioxolane ring may be substituted with one or more $C_{1-6}$ alkyl groups, for example two or more $C_{1-6}$ alkyl groups. For example, the 1,3-dioxolane may be substituted with geminal or vicinal $C_{1-6}$ alkyl groups in any substitution pattern, for example geminal or vicinal methyl groups. In some examples, the 1,3-dioxolane ring may be substituted with one, two, three or four $C_{1-6}$ alkyl groups, for example one, two, three or four methyl groups. It will be understood that in all of the above mentioned examples, $C_{1-6}$ alkyl comprises methyl, ethyl, propyl, butyl, pentyl and hexyl and all regioisomers thereof.

In some embodiments of the invention, the 1,3-dioxane ring may be substituted with one or more substituent selected from alkyl, ester, cycloalkyl, cycloalkenyl, haloalkyl, aryl, heteroaryl or vinyl in any substitution pattern. In some examples, alkyl comprises $C_{1-6}$ (chloro)alkyl, for example (chloro)methyl, (chloro)ethyl, (chloro)propyl and also comprises (chloro)cycloalkyl and aryl in which two substituents on the 1,3-dioxane ring may be joined to form a cyclic group, for example a 5- or 6-membered carbocycle fused to the 1,3-dioxane ring. In some examples, the 1,3-dioxane ring may be substituted with one or more $C_{1-6}$ alkyl groups, for example two or more $C_{1-6}$ alkyl groups. For example, the 1,3-dioxane may be substituted with geminal or vicinal $C_{1-6}$ alkyl groups in any substitution pattern, for example geminal or vicinal methyl groups. In some examples, the 1,3-dioxane ring may be substituted with one, two, three or four $C_{1-6}$ alkyl groups, for example one, two, three or four methyl groups. It will be understood that in all of the above mentioned examples, $C_{1-6}$ alkyl comprises methyl, ethyl, propyl, butyl, pentyl and hexyl and all regioisomers thereof.

In some embodiments of the invention, the 1,3-dioxepane ring may be substituted with one or more substituent selected from alkyl, ester, cycloalkyl, cycloalkenyl, haloalkyl, aryl, heteroaryl or vinyl in any substitution pattern. In some examples, alkyl comprises $C_{1-6}$ (chloro)alkyl, for example (chloro)methyl, (chloro)ethyl, (chloro)propyl and also comprises (chloro)cycloalkyl and aryl in which two substituents on the 1,3-dioxepane ring may be joined to form a cyclic group, for example a 5- or 6-membered carbocycle fused to the 1,3-dioxepane ring. In some examples, the 1,3-dioxepane ring may be substituted with one or more $C_{1-6}$ alkyl groups, for example two or more $C_{1-6}$ alkyl groups. For example, the 1,3-dioxepane may be substituted with geminal or vicinal $C_{1-6}$ alkyl groups in any substitution pattern, for example geminal or vicinal methyl groups. In some examples, the 1,3-dioxepane ring may be substituted with one, two, three or four $C_{1-6}$ alkyl groups, for example one, two, three or four methyl groups. It will be understood that in all of the above mentioned examples, $C_{1-6}$ alkyl comprises methyl, ethyl, propyl, butyl, pentyl and hexyl and all regioisomers thereof.

In some embodiments of the invention, the 1,3-dioxocane ring may be substituted with one or more substituent selected from alkyl, ester, cycloalkyl, cycloalkenyl, haloalkyl, aryl, heteroaryl or vinyl in any substitution pattern. In some examples, alkyl comprises $C_{1-6}$ (chloro)alkyl, for example (chloro)methyl, (chloro)ethyl, (chloro)propyl and also comprises (chloro)cycloalkyl and aryl in which two substituents on the 1,3-dioxocane ring may be joined to form a cyclic group, for example a 5- or 6-membered carbocycle fused to the 1,3-dioxocane ring. In some examples, the 1,3-dioxocane ring may be substituted with one or more $C_{1-6}$ alkyl groups, for example two or more $C_{1-6}$ alkyl groups. For example, the 1,3-dioxocane may be substituted with geminal or vicinal $C_{1-6}$ alkyl groups in any substitution pattern, for example geminal or vicinal methyl groups. In some examples, the 1,3-dioxocane ring may be substituted with one, two, three or four $C_{1-6}$ alkyl groups, for example one, two, three or four methyl groups. It will be understood that in all of the above mentioned examples, $C_{1-6}$ alkyl comprises methyl, ethyl, propyl, butyl, pentyl and hexyl and all regioisomers thereof.

In some embodiments of the invention, the 1,3-dioxonane ring may be substituted with one or more substituent selected from alkyl, ester, cycloalkyl, cycloalkenyl, haloalkyl, aryl, heteroaryl or vinyl in any substitution pattern. In some examples, alkyl comprises $C_{1-6}$ (chloro)alkyl, for example (chloro)methyl, (chloro)ethyl, (chloro)propyl and also comprises (chloro)cycloalkyl and aryl in which two substituents on the 1,3-dioxonane ring may be joined to form a cyclic group, for example a 5- or 6-membered carbocycle fused to the 1,3-dioxonane ring. In some examples, the 1,3-dioxonane ring may be substituted with one or more $C_{1-6}$ alkyl groups, for example two or more $C_{1-6}$ alkyl groups. For example, the 1,3-dioxonane may be substituted with geminal or vicinal $C_{1-6}$ alkyl groups in any substitution pattern, for example geminal or vicinal methyl groups. In some examples, the 1,3-dioxonane ring may be substituted with one, two, three or four $C_{1-6}$ alkyl groups, for example one, two, three or four methyl groups. It will be understood that in all of the above mentioned examples, $C_{1-6}$ alkyl comprises methyl, ethyl, propyl, butyl, pentyl and hexyl and all regioisomers thereof.

It will be understood that these exemplifications have been given only by way of example and are by no means limiting.

Compounds of the invention may have good solubility in aqueous media before and after deprotection. This may be characterised by reference to the octanol-water partition coefficient which may be calculated by various means. For example, preferred compounds of the invention have a calculated log P (C log P) or mi log P as measured using the Molinspiration cheminformatics software, of less than 4.5, preferably less than 4.0. In other cases, the compounds of the invention may have improved solubility after deprotection.

The present invention also relates to the deprotected and deblocked form of the compounds of formula I or II in which the ketal, e.g. the 1,3-dioxolane ketone blocking group, or the 1,3-dioxane ketone blocking group, or the 1,3-dioxepane ketone blocking group, or the 1,3-dioxocane ketone blocking group, or the 1,3-dioxonane ketone blocking group, the 1,3-dioxolane ketone blocking groups and associated linker, or the 1,3-dioxane ketone blocking groups and associated linker, or the 1,3-dioxepane ketone blocking groups and associated linker, or the 1,3-dioxocane ketone blocking groups and associated linker, or the 1,3-dioxonane ketone blocking groups and associated linker has been removed, and which have the formula III

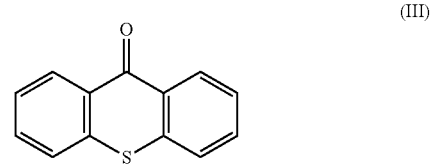 [SMILES: O=c1c2ccccc2sc2ccccc12]

(III)

the compound of formula III having the same substitution pattern as the compound of formula I or II and the compound is obtainable by reacting the compound of formula I or II in the presence of an acid, or in the presence of an acid and heat.

The compound of formula III may be obtainable by reacting the compound of formula I or II in the presence of an acid and heat. The acid and heat treatments may be simultaneous or may be subsequent. For example, the compound of formula III may be obtainable by firstly reacting the compound of formula I or II in the presence of an acid, followed by a subsequent heat treatment.

Examples of compounds of Formula (I), (II) and (III) of the invention are as follows in Table 1, with selected compounds and their respective mi log P values shown in Table 2.

TABLE 1

| Structure | Name |
|---|---|
| | 2-[4-(2-acetoxyethoxy)-9-oxo-thioxanthen-3-yl]oxyethyl acetate |
| | 3,4-bis(2-hydroxyethoxy)thioxanthen-9-one |
| | 2-[4'-(2-acetoxyethoxy)spiro[1,5-dihydro-2,4-benzodioxepine-3,9'-thioxanthene]-3'-yl]oxyethyl acetate |
| | 2-[4'-(2-hydroxyethoxy)spiro[1,5-dihydro-2,4-benzodioxepine-3,9'-thioxanthene]-3'-yl]oxyethanol |

TABLE 1-continued

| Structure | Name |
|---|---|
|  | 2-[4'-(2-acetoxyethoxy)-5-phenyl-spiro[1,3-dioxane-2,9'-thioxanthene]-3'-yl]oxyethyl acetate |
|  | 2-[4'-(2-hydroxyethoxy)-5-phenyl-spiro[1,3-dioxane-2,9'-thioxanthene]-3'-yl]oxyethanol |
|  | 2-[4'-(2-acetoxyethoxy)-5,5-dimethyl-spiro[1,3-dioxane-2,9'-thioxanthene]-3'-yl]oxyethyl acetate |

TABLE 1-continued

| Structure | Name |
|---|---|
|  | 2-[4'-(2-hydroxyethoxy)-5,5-dimethyl-spiro[1,3-dioxane-2,9'-thioxanthene]-3'-yl]oxyethanol |
|  | 2-[4'-(2-acetoxyethoxy)spiro[1,3-dioxepane-2,9'-thioxanthene]-3'-yl]oxyethyl acetate |
|  | 2-[4'-(2-hydroxyethoxy)spiro[1,3-dioxepane-2,9'-thioxanthene]-3'-yl]oxyethanol |
|  | 2-[4'-(2-acetoxyethoxy)spiro[1,3-dioxane-2,9'-thioxanthene]-3'-yl]oxyethyl acetate |

TABLE 1-continued

| Structure | Name |
|---|---|
| | 2-[4'-(2-hydroxyethoxy)spiro[1,3-dioxane-2,9'-thioxanthene]-3'-yl]oxyethanol |
| | 2-[4'-(2-acetoxyethoxy)-5-[4-[3',4'-bis(2-acetoxyethoxy)spiro[1,3-dioxane-2,9'-thioxanthene]-5-yl]phenyl]spiro[1,3-dioxane-2,9'-thioxanthene]-3'-yl]oxyethyl acetate |
| | 2-[5-[4-[3',4'-bis(2-hydroxyethoxy)spiro[1,3-dioxane-2,9'-thioxanthene]-5-yl]phenyl]-4'-(2-hydroxyethoxy)spiro[1,3-dioxane-2,9'-thioxanthene]-3'-yl]oxyethanol |

TABLE 1-continued

| Structure | Name |
|---|---|
| | 2-{3'-[2-(acetyloxy)ethoxy]-5-{4'-[2-(acetyloxy)ethoxy]-3'-{2-[(1-hydroxyethenyl)oxy]ethoxy}spiro[1,3-dioxane-2,9'-thioxanthen]5-yo}spiro[1,3-dioxane-2,9'-thioxanthen]-4'yloxy}ethyl acetate |
| | 2-{5'-[3',4'-bis(2-hydroxyethoxy)spiro[1,3-dioxane-2,9'thioxanthen]-5-yl]-3'-(2-hydroxyethoxy)spiro[1,3-dioxane-2,9'thioxanthen]-4'-yloxy}ethan-1-ol |

TABLE 1-continued
| Structure | Name |
|---|---|
| 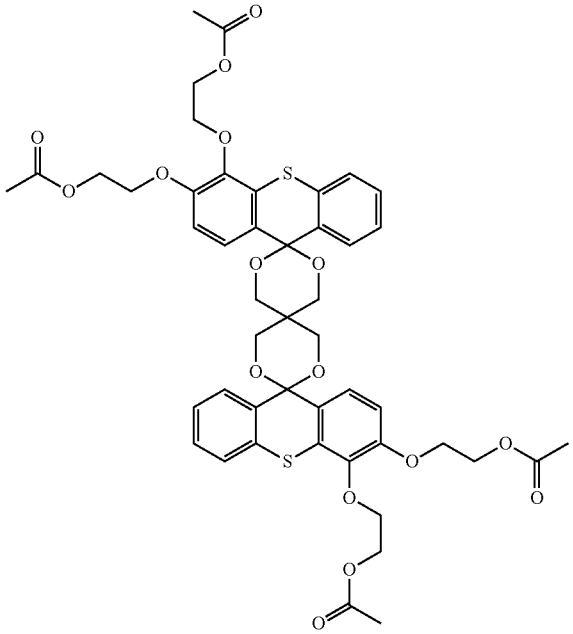 [SMILES: CC(=O)OCCOc1ccc2c(c1OCCOC(C)=O)Sc1ccccc1C21OCC2(CO1)COC1(OC2)c2ccccc2Sc2c1ccc(OCCOC(C)=O)c2OCCOC(C)=O] | 2-{3,4'''-bis[2-(acetyloxy)ethoxy]-3'''-{2-[(1-hydroxyethenyl)oxy]ethoxy}-trispiro[thioxanthene-9,2':5'm5''-bis([1,3]dioxane)-2'',9'''-thioxanthen]4-yloxy}ethyl acetate |
| 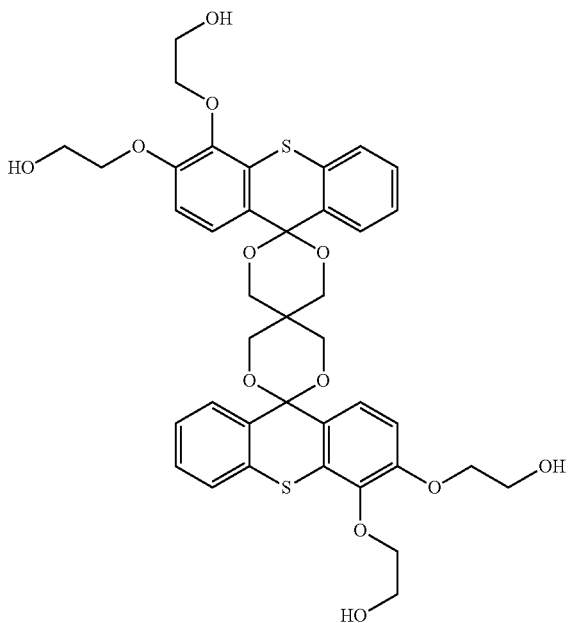 [SMILES: OCCOc1ccc2c(c1OCCO)Sc1ccccc1C21OCC2(CO1)COC1(OC2)c2ccccc2Sc2c1ccc(OCCO)c2OCCO] | 2-[3,3''',4'''-tris(2-hydroxyethoxy)trispiro-[thioxanthene-9,2':5',5''-bis([1,3]dioxane)-2'',9'''-thioxanthen]-4-yloxy]ethan-1-ol |

TABLE 1-continued

| Structure | Name |
|---|---|
| | 2-{3'-[2-acetyloxy)ethoxy]-5-{4'-[2-(acetyloxy)ethoxy]-3'-{2-[(1-hydroxyethenyl)oxy]ethoxy}spiro[1,3-dioxane-2,9'thioxanthen]-5-yl}spiro[1,3-dioxane-2,9'-thioxanthen]-4'yloxy}ethyl acetate |
| | 2-{5-[3',4'-bis(2-hydroxyethoxy)spiro[1,3-dioxane-2,9'-thioxanthen]-5-yl]-3'-(2-hydroxyethoxy)spiro[1,3-dioxane-2,9'-thioxanthen]4'-yloxy}ethan-1-ol |

TABLE 1-continued
| Structure | Name |
|---|---|
| 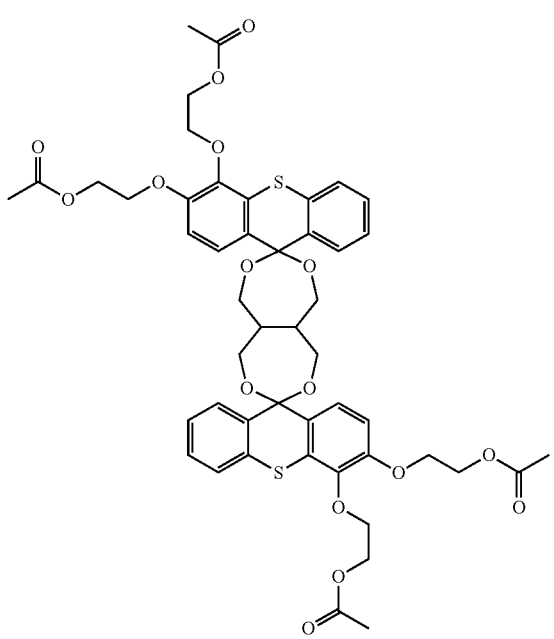 [SMILES: CC(=O)OCCOc1ccc2c(c1OCCOC(C)=O)Sc1ccccc1C21OCC2COC3(OCC2CO1)c1ccccc1Sc1c3ccc(OCCOC(C)=O)c1OCCOC(C)=O] | 2-{3",4",6-tris[2-acetyloxy)ethoxy]-1',5',5'a,6',10',10'a-hexahydrospiro[thioxanthene-9,8'-[2,4,7,9]tetraoxaheptalene-3',9"thioxantehen]-5-yloxy}ethyl acetate |
| 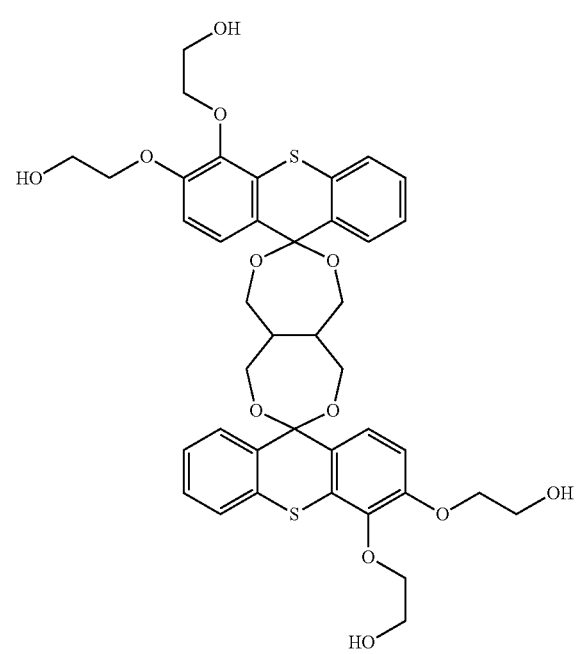 [SMILES: OCCOc1ccc2c(c1OCCO)Sc1ccccc1C21OCC2COC3(OCC2CO1)c1ccccc1Sc1c3ccc(OCCO)c1OCCO] | 2-[3",4",6-tris(2-hydroxyethoxy)-1',5',5'a,6',10',10'a-hexahydrodispiro[thioxanthene-9,8'-[2,4,7,9]tetraoxaheptalene-3',9"-thioxanthen]5-yloxy]ethan-1-ol |

TABLE 1-continued

| Structure | Name |
|---|---|
|  | 2-[4'-(2-acetoxyethoxy)-5-[2-[3',4'-bis(2-acetoxyethoxy)spiro[1,3-dioxane-2,9'-thioxanthene]-5-yl]ethyl]spiro[1,3-dioxane-2,9'-thioxanthene]-3'-yl]oxyethyl acetate |
|  | 2-[5-[2-[3',4'-bis(2-hydroxyethoxy)spiro[1,3-dioxane-2,9'-thioxanthene]-5-yl]ethyl]-4-(2-hydroxyethoxy)spiro[1,3-dioxane-2,9'-thioxanthene]-3'-yl]oxyethanol |
|  | 5-[2-(3',4'-dimethoxyspiro[1,3-dioxane-2,9'-thioxanthene]-5-yl)ethyl]-3',4'-dimethoxy-spiro[1,3-dioxane-2,9'-thioxanthene] |

TABLE 1-continued

| Structure | Name |
|---|---|
| | (1-ethylcyclopentyl) 2-[4-[2-(1-ethylcyclopentoxy)-2-oxo-ethoxy]-9-oxo-thioxanthen-3-yl]oxyacetate |
| | (1-ethylcyclopentyl) 2-[4'-[2-(1-ethylcyclopentoxy)-2-oxo-ethoxy]spiro[1,3-dioxolane-2,9'-thioxanthene]-3'-yl]oxyacetate |
| | (1-ethylcyclopentyl) 2-[4'-[2-(1-ethylcyclopentoxy)-2-oxo-ethoxy]-4,6-dimethyl-spiro[1,3-dioxane-2,9'-thioxanthene]-3'-yl]oxyacetate |
| R = methyl adamantyl | (2-methyl-2-adamantyl) 2-[4'-[2-[(2-methyl-2-adamantyl)oxy]-2-oxo-ethoxy]spiro[1,3-dioxolane-2,9'-thioxanthene]-3'-yl]oxyacetate |

TABLE 1-continued

| Structure | Name |
|---|---|
|  | (2-methyl-2-adamantyl) 2-[4'-[2-[(2-methyl-2-adamantyl)oxy]-2-oxo-ethoxy]spiro[1,3-dioxane-2,9'-thioxanthene]-3'-yl]oxyacetate |
|  | (2-methyl-2-adamantyl) 2-[4,6-dimethyl-4'-[2-[(2-methyl-2-adamantyl)oxy]-2-oxo-ethoxy]spiro[1,3-dioxane-2,9'-thioxanthene]-3'-yl]oxyacetate |
|  | (2-methyl-2-adamantyl) 2-[4-[2-[(2-methyl-2-adamantyl)oxy]-2-oxo-ethoxy]-9-oxo-thioxanthen-3-yl]oxyacetate |

TABLE 2

| Compound | miLogP value |
|---|---|
| 2-[4-(2-acetoxyethoxy)-9-oxo-thioxanthen-3-yl]oxyethyl acetate | 3.53 |
| 3,4-bis(2-hydroxyethoxy)thioxanthen-9-one | 2.77 |
| 2-[4'-(2-acetoxyethoxy)spiro[1,5-dihydro-2,4-benzodioxepine-3,9'-thioxanthene]-3'-yl]oxyethyl acetate | 4.78 |
| 2-[4'-(2-hydroxyethoxy)spiro[1,5-dihydro-2,4-benzodioxepine-3,9'-thioxanthene]-3'-yl]oxyethanol | 3.56 |
| 2-[4'-(2-acetoxyethoxy)-5-phenyl-spiro[1,3-dioxane-2,9'-thioxanthene]-3'-yl]oxyethyl acetate | 5.33 |
| 2-[4'-(2-hydroxyethoxy)-5-phenyl-spiro[1,3-dioxane-2,9'-thioxanthene]-3'-yl]oxyethanol | 4.11 |
| 2-[4'-(2-acetoxyethoxy)-5,5-dimethyl-spiro[1,3-dioxane-2,9'-thioxanthene]-3'-yl]oxyethyl acetate | 4.42 |
| 2-[4'-(2-hydroxyethoxy)-5,5-dimethyl-spiro[1,3-dioxane-2,9'-thioxanthene]-3'-yl]oxyethanol | 3.5 |
| 2-[4'-(2-acetoxyethoxy)spiro[1,3-dioxepane-2,9'-thioxanthene]-3'-yl]oxyethyl acetate | 3.8 |
| 2-[4'-(2-hydroxyethoxy)spiro[1,3-dioxepane-2,9'-thioxanthene]-3'-yl]oxyethanol | 2.58 |
| 2-[4'-(2-acetoxyethoxy)spiro[1,3-dioxane-2,9'-thioxanthene]-3'-yl]oxyethyl acetate | 3.53 |
| 2-[4'-(2-hydroxyethoxy)spiro[1,3-dioxane-2,9'-thioxanthene]-3'-yl]oxyethanol | 2.31 |
| 2-[4'-(2-acetoxyethoxy)-5-[4-[3',4'-bis(2-acetoxyethoxy)spiro[1,3-dioxane-2,9'-thioxanthene]-5-yl]phenyl]spiro[1,3-dioxane-2,9'-thioxanthene]-3'-yl]oxyethyl acetate | 8.54 |
| 2-[5-[4-[3',4'-bis(2-hydroxyethoxy)spiro[1,3-dioxane-2,9'-thioxanthene]-5-yl]phenyl]-4'-(2-hydroxyethoxy)spiro[1,3-dioxane-2,9'-thioxanthene]-3'-yl]oxyethanol | 6.28 |
| 2-{3'-[2-(acetyloxy)ethoxy]-5-{4'-[2-(acetyloxy)ethoxy]-3'-{2-[(1-hydroxyethenyl)oxy]ethoxy}spiro[1,3-dioxane-2,9'-thioxanthen]-5-yo}spiro[1,3-dioxane-2,9'-thioxanthen]-4'yloxy]ethyl acetate | 7.57 |
| 2-{5'-[3',4'-bis(2-hydroxyethoxy)spiro[1,3-dioxane-2,9'thioxanthen]-5-yl]-3'-(2-hydroxyethoxy)spiro[1,3-dioxane-2,9'thioxanthen]-4'-yloxy}ethan-1-ol | 5.13 |
| 2-{3,4'''-bis[2-(acetyloxy)ethoxy]-3'''-{2-[(1-hydroxyethenyl)oxy]ethoxy}trispiro[thioxanthene-9,2':5'm5''- | 6.28 |

TABLE 2-continued

| Compound | miLogP value |
|---|---|
| bis([1,3]dioxane)-2'',9'''thioxanthen]4-yloxy}ethyl acetate | |
| 2-[3,3''',4''''-tris(2-hydroxyethoxy)trispiro[thioxanthene-9,2':5'',5''-bis([1,3]dioxane)-2'',9'''-thioxanthen]-4-yloxy]ethan-1-ol | 3.84 |
| 2-{3'-[2-acetyloxy)ethoxy]-5-{4'-[2-(acetyloxy)ethoxy]-3'-{2-[(1-hydroxyethenyl)oxy]ethoxy}spiro[1,3-dioxane-2,9'thioxanthen]-5-yl}spiro[1,3-dioxane-2,9'-thioxanthen]-4'yloxy}ethyl acetate | 6.95 |
| 2-{5-[3',4'-bis(2-hydroxyethoxy)spiro[1,3-dioxane-2,9'-thioxanthen]-5-yl]-3'-(2-hydroxyethoxy)spiro[1,3-dioxane-2,9'-thioxanthen]4'-yloxy}ethan-1-ol | 4.51 |
| 2-{3'',4'',6-tris[2-acetyloxy)ethoxy]-1',5',5'a,6',10',10'a-hexahydrospiro[thioxanthene-9,8'-[2,4,7,9]tetraoxaheptalene-3',9''thioxanthen]-5-yloxy}ethyl acetate | 6.95 |
| 2-[3'',4'',6-tris(2-hydroxyethoxy)-1',5',5'a,6',10',10'a-hexahydrodispiro[thioxanthene-9,8'-[2,4,7,9]tetraoxaheptalene-3',9''-thioxanthen]5-yloxy]ethan-1-ol | 4.51 |
| 2-[4'-(2-acetoxyethoxy)-5-[2[3,4'-bis(2-acetoxyethoxy)spiro[1,3-dioxane-2,9'-thioxanthene-5-yl]ethyl]spiro[1,3-dioxane-2,9'-thioxanthene]-3'-yl]oxyethyl acetate | 7.49 |
| 2-[5-[2-[3',4'-bis(2-hydroxyethoxy)spiro[1,3-dioxane-2,9'-thioxanthene]-5-yl]ethyl]-4'-(2-hydroxyethoxy)spiro[1,3-dioxane-2,9'-thioxanthene]-3'-yl]oxyethanol | 5.05 |
| 5-[2-(3',4'-dimethoxyspiro[1,3-dioxane-2,9'-thioxanthene]-5-yl)ethyl]-3',4'-dimethoxy-spiro[1,3-dioxane-2,9'-thioxanthene] | 7.58 |
| (1-ethylcyclopentyl) 2-[4-[2-(1-ethylcyclopentoxy)-2-oxo-ethoxy]-9-oxo-thioxanthen-3-yl]oxyacetate | 8.37 |
| (1-ethylcyclopentyl) 2-[4'-[2-(1-ethylcyclopentoxy)-2-oxo-ethoxy]spiro[1,3-dioxolane-2,9'-thioxanthene]-3'-yl]oxyacetate | 7.73 |
| (1-ethylcyclopentyl) 2-[4'-[2-(1-ethylcyclopentoxy)-2-oxo-ethoxy]-4,6-dimethyl-spiro[1,3-dioxane-2,9'-thioxanthene]-3'-yl]oxyacetate | 8.54 |
| (2-methyl-2-adamantyl) 2-[4'-[2-[(2-methyl-2-adamantyl)oxy]-2-oxo-ethoxy]spiro[1,3-dioxolane-2,9'-thioxanthene]-3'-yl]oxyacetate | 8.90 |
| (2-methyl-2-adamantyl) 2-[4'-[2-[(2-methyl-2-adamantyl)oxy]-2-oxo-ethoxy]spiro[1,3-dioxane-2,9-thioxanthene]-3'-yl]oxyacetate | 9.01 |
| (2-methyl-2-adamantyl) 2-[4,6-dimethyl-4'-[2-[(2-methyl-2-adamantyl)oxy]-2-oxo-ethoxy]spiro[1,3-dioxane-2,9'-thioxanthene]-3'-yl]oxyacetate | 9.24 |
| (2-methyl-2-adamantyl) 2-[4-[2-[(2-methyl-2-adamantyl)oxy]-2-oxo-ethoxy]-9-oxo-thioxanthen-3-yl]oxyacetate | 9.16 |

Compositions and Photoinitiated Methods

In a second aspect, the present invention relates to a composition comprising:
  a compound of formula I or II as defined above; and
  a chemically transformable substrate;
  wherein the compound of formula I or II is a precursor of a reactive derivative of formula III:

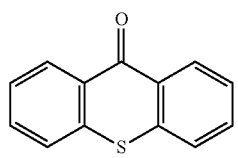

(III)

the compound of formula III having the same substitution pattern on the thioxanthene ring as the compound of formula I or II and, the compound of formula III being obtainable by reacting the compound of formula I or II in the presence of an acid;
  and further wherein the transformable substrate is capable of being transformed in the presence of the compound of formula III by a direct photoinitiated reaction or an indirect photoinitiated reaction.

In the composition of the second aspect, the compound of formula I or II may be a precursor of a reactive derivative of a compound of formula III having any substitution pattern as described above.

The compound formula III may be obtainable by reacting the compound of formula I or II in the presence of an acid and heat. The acid and heat treatments may be simultaneous or may be subsequent. For example, the compound of formula III may be obtainable by firstly reacting the compound of formula I or II in the presence of an acid, followed by a subsequent heat treatment.

The compositions of the invention may be used in photoinitiated methods. Thus, in a third aspect of the invention, there is provided a photoinitiated method which comprises:
  (a) forming a layer of a composition of the second aspect of the invention on a support;
  (b) applying an acid, or generating an acid in situ, in selected regions of the layer and permitting the acid to react with the compound of formula I or II and form the reactive derivative of formula III in said selected regions of the layer;
  (c) exposing the layer with the reactive derivative present in said selected regions to electromagnetic radiation of a wavelength or energy suitable to generate a reactive species from the compound of formula III; and
  (d) permitting the reactive species directly or indirectly to cause transformation of the transformable substrate.

In some embodiments, permitting the acid to react with the compound of formula I or II and form the reactive derivative of formula III may comprise application of heat. The application of heat may be simultaneous with the applying of an acid or generating an acid in situ, or it may be subsequent to this step.

In some embodiments, the method may further comprise performing a pre-transformation and/or a post-transformation heat treatment. In other words, following c) above in which the layer with the reactive derivative is exposed to electromagnetic radiation, there may be a heat treatment to enable reaction of acid present with the transformable substrate. Similarly, following d) above in which the reactive species causes transformation of the transformable substrate, there may be a heat treatment, to initiate curing in the remaining transformed substrate.

The reactive species may, for example, be a free radical species or an energetically excited form of compound of formula III.

In one embodiment, an acid may be applied to selected regions of the layer to react with the compound of formula I or II and form the reactive derivative of formula III in said selected regions of the layer. The acid may, for example, be applied by spraying or ink jet printing.

In another embodiment, an acid generator is incorporated in the composition applied to the substrate. Preferred is a photoacid generator (PAG), but thermal acid generators (TAG) are also operable. The acid generator is a species which is capable of generating acid in response to an external stimulus, thereby allowing acid to be generated in situ, which acid reacts with the compound of formula I or II to form the reactive derivative of formula III in selected regions of the layer where the acid has been generated. Although presently less preferred, the acid generator may be applied to the layer subsequent to the formation of the layer, by for example spraying or ink jet printing.

In some examples, the application of acid or generation of acid in situ is followed by a heat treatment step, in order to permit the acid to sufficiently react with the compound of formula I or II and form the reactive derivative of formula III in all selected regions of the layer. The heat treatment step may be performed regardless of whether the acid was applied externally, or generated by a photoacid generator or a thermal acid generator. The temperature and duration of the heat treatment may vary depending, for example, on the concentration and strength of an acid applied externally, or on the intensity and duration of an exposure to electromagnetic radiation in the case of a photoacid generator.

The reactive derivative of formula III is formed in the selected regions of the layer in a first stage of the method. In the subsequent stage, exposure to electromagnetic radiation of a suitable wavelength causes a reactive species to be generated from the compound of formula III. In the case that the first stage is carried out photochemically using a PAG, the wavelength of the electromagnetic radiation used in the subsequent stage is different to the wavelength of the electromagnetic radiation used in the first stage and is selected to avoid the generation of further acid from the PAG. This allows the application of electromagnetic radiation in the second stage to be conducted at high energy as a flood radiation which does not need to be carried out in an imagewise fashion.

As used herein, a direct photoinitiated reaction is one in which the reactive species which is generated from the compound of formula III directly causes transformation of the transformable substrate. This may, for example, occur where the reactive species directly initiates polymerisation of a polymerisable monomer.

An indirect photoinitiated reaction is one in which the reactive species which is generated from the compound of formula III indirectly causes transformation of the reactive substrate. This may, for example, occur where the reactive species interacts with a second photoinitiator or synergist by transferring its energy or electron(s) to the other species which then initiates or causes transformation of the transformable substrate. Another example of an indirect photoinitiated reaction is one in which the reactive species photosensitises a photoacid generator to generate acid which is capable of causing transformation of a polymerisable substrate via cationic polymerisation, or which is capable of removing acid labile protecting groups of a protected polymer to render the polymer soluble in a suitable developer. In such a method, generating acid capable of causing transformation of a polymerisable substrate may be performed with the application of heat. In some examples, there may also be a heat treatment following dissolution and wash-off of solubilised polymer to permit cure of the remaining composition.

The compositions of the invention have particular suitability as photoresist compositions. A layer of such a composition on a substrate, such as may be used in the method of the third aspect of the invention, is termed a photoresist. Another aspect of the present invention is a photoresist layer formed of the composition of the second aspect of the invention on a substrate.

The transformable substrate may be a polymerisable substrate, for example a cationically polymerisable substrate or a free radical promoted polymerisable substrate or a substrate containing acid labile protecting groups on a protected polymer which can be removed by acid to render the polymer soluble in a suitable developer.

The cationic polymerisable compounds may be monomers, oligomers and/or prepolymers. These monomers, oligomers and/or prepolymers may possess different degrees of functionality. A mixture including combinations of mono-, di-, tri- and higher functional monomers, oligomers and/or prepolymers may be used.

In a preferred embodiment, the monomer, oligomer or prepolymer includes at least one epoxy, at least one vinyl ether, or at least one oxetane group as a polymerisable group.

Examples of monomers, oligomers or prepolymers containing at least one epoxide group include, epichlorohydrin-bisphenol S based epoxides, epoxidised styrenics and more epichlorohydrin-bisphenol F and A based epoxides and epoxidised novolacs, alicyclic polyepoxide, polyglycidyl ester of polybasic acid, polyglycidyl ether of polyol, polyglycidyl ether of polyoxyalkylene glycol, polyglycidyl ester of aromatic polyol, polyglycidyl ether of aromatic polyol, urethane polyepoxy compound and polyepoxy polybutadiene cycloaliphatic epoxy compounds such as bis-(3,4-epoxycyclohexyl)-adipate, 3,4-epoxycyclohexylmethyl-3,4-epoxycyclohexane carboxylate, poly[(2-oxiranyl)-1,2-cyclohexanediol]-2-ethyl-2-(hydroxymethyl)-1,3-propanediol ether, 7-oxabicyclo[4.1.0] hept-3-ylmethyl 7-oxa-bicyclo[4.1.0]heptane-3-carboxylate; ether derivatives including diol derivatives such as 3-(bis(glycidyloxymethyl)methoxy)-1,2-propane diol, limonene oxide, 2-biphenyl glycidyl ether, 1,4-butanediol diglycidylether and neopentyl glycol diglycidylether; glycidyl ethers such as n-butyl glycidyl ether, distilled butyl glycidyl ether, 2-ethylhexyl glycidyl ether, $C_{8-10}$ aliphatic glycidyl ether, $C_{12-14}$ aliphatic glycidyl ether, o-cresyl glycidyl ether, p-tertiary butyl phenyl glycidyl ether, nonyl phenyl glycidyl ether, phenyl glycidyl ether, cyclohexanedimethanol diglycidyl ether, polypropylene glycol diglycidyl ether, poly glycol diglycidyl ether, dibromo neopentyl glycol diglycidyl ether, trimethylopropane triglycidyl ether, castor oil triglycidyl ether, propoxylated glycerine triglycidyl ether, sorbitol polyglycidyl ether, glycidyl ester of neodecanoic acid; and glycidyl amines such as epoxidised meta-xylene diamine.

Examples of monomers, oligomers or prepolymers containing at least one vinyl ether group include ethyl vinyl ether, n-butyl vinyl ether, isobutyl vinyl ether, octadecyl vinyl ether, cyclohexyl vinyl ether, butanediol divinyl ether, hydroxyl butyl vinyl ether, cyclohexane dimethanol monovinyl ether, phenyl vinyl ether, p-methylphenyl vinyl ether, p-methoxyphenyl vinyl ether, a-methylphenyl vinyl ether, b-methylisobutyl vinyl ether and b-chloroisobutyl vinyl ether, diethyleneglycol divinyl ether, triethylene glycol divinyl ether, n-propyl vinyl ether, isopropyl vinyl ether, dodecyl vinyl ether, diethylene glycol monovinyl ether, cyclohexanedimethanol divinyl ether, 4-(vinyloxy)butyl benzoate, bis[4-(vinyloxy)butyl]adipate, bis[4-(vinyloxy)butyl] succinate, 4-(vinyloxy methyl)cyclohexylmethyl benzoate, bis[4-(vinyloxy)butyl] isophthalate, bis[4-(vinyloxymethyl) cyclohexylmethyl]glutarate, tris[4-(vinyloxy)butyl]trimellitate, 4-(vinyloxy)butyl steatite, bis[4-(vinyloxy)butyl] hexanediylbiscarbamate, bis[4-(vinyloxy)methyl] cyclohexyl]methyl]terephthalate, bis[4-(vinyloxy)methyl] cyclohexyl]methyl]isophthalate, bis[4-(vinyloxy)butyl](4-methyl-1,3-phenylene)-biscarbamate, bis[4-(vinyloxy) butyl](methylenedi-4,1-phenylene) biscarbamate and 3-amino-1-propane vinyl ether.

Examples of monomers, oligomers or prepolymers containing at least one oxetane group include 3,3'-oxybis(methylene)bis(3-ethyloxetane), 3-ethyl-3-hydroxymethyl-1-oxetane, the oligomeric mixture 1,4-bis[3-ethyl-3-oxetanyl methoxy)methyl]benzene, 3-ethyl-3-[(phenylmethoxy) methyl]-oxetane, 3-ethyl-3-[(2-ethylhexyloxy) methyl]oxetane and bis[1-Ethyl(3-oxetanyl)]methylether, 3-ethyl-[(triethoxysilyl propoxy)methyl]oxetane and 3,3-dimethyl-2(p-methoxy-phenyl)-oxetane.

The free radical polymerisable compounds may be monomers, oligomers and/or prepolymers. These monomers, oligomers and/or prepolymers may possess different degrees of functionality. A mixture including combinations of mono-, di-, tri- and higher functional monomers, oligomers and/or prepolymers may be used.

In another preferred embodiment the monomer, oligomer or prepolymer includes at least one acrylate or at least one methacrylate group as a polymerisable group.

Suitable free radical promoted polymerisable monofunctional or polyfunctional monomers are: isoamyl acrylate, stearyl acrylate, lauryl acrylate, octyl acrylate, decyl acrylate, isoamylstyl acrylate, isostearyl acrylate, 2-ethylhexyl-diglycol acrylate, 2-hydroxybutyl acrylate, 2-acryloyloxy-ethylhexahydrophthalic acid, butoxyethyl acrylate, ethoxydiethylene glycol acrylate, methoxydiethylene glycol acrylate, methoxypolyethylene glycol acrylate, methoxypropylene glycol acrylate, phenoxyethyl acrylate, tetrahydrofurfuryl acrylate, isobornyl acrylate, 2-hydroxyethyl acrylate, 2-hydroxypropyl acrylate, 2-hydroxy-3-phenoxypropyl acrylate, vinyl ether acrylate, 2-acryloyloxyethylsuccinic acid, 2-acryloyloxyethylphthalic acid, 2-acryloxyethyl-2-hydroxyethyl-phthalic acid, lactone modified flexible acrylate and t-butylcyclohexyl acrylate, triethylene glycol diacrylate, tetraethylene glycol diacrylate, polyethylene glycol diacrylate, dipropylene glycol diacrylate, tripropylene glycol diacrylate, polypropylene glycol diacrylate, 1,4-butanediol diacrylate, 1,6-hexanediol diacrylate, 1,9-nonanediol diacrylate, neopentyl glycol diacrylate, dimethylol-tricyclodecane diacrylate, bisphenol A EO (ethylene oxide) adduct diacrylate, bisphenol A PO (propylene oxide) adduct diacrylate, hydroxypivalate neopentyl glycol diacrylate, propoxylated neopentyl glycol diacrylate, alkoxylated dimethyloltricyclodecane diacrylate and polytetramethylene glycol diacrylate, trimethylolpropane triacrylate, EO modified trimethylolpropane triacrylate, tri(propylene glycol) triacrylate, caprolactone modified trimethylolpropane triacrylate, pentaerythritol triacrylate, pentaerythritol tetraacrylate, pentaerythritolethoxy tetraacrylate, dipentaerythritol hexaacrylate, ditrimethylolpropane tetraacrylate, glycerinpropoxy triacrylate and caprolactam modified dipentaerythritol hexaacrylate, or an N-vinylamide such as, N-vinyl-caprolactam or N-vinylformamide; or acrylamide or a substituted acrylamide, such as acryloylmorpholine.

Other suitable monofunctional acrylates include caprolactone acrylate, cyclic trimethylolpropane formal acrylate, ethoxylated nonyl phenol acrylate, isodecyl acrylate, isooctyl acrylate, octyldecyl acrylate, alkoxylated phenol acrylate, tridecyl acrylate and alkoxylated cyclohexanone dimethanol diacrylate.

Other suitable difunctional acrylates include alkoxylated cyclohexanone dimethanol diacrylate, alkoxylated hexanediol diacrylate, dioxane glycol diacrylate, cyclohexanone dimethanol diacrylate, diethylene glycol diacrylate and neopentyl glycol diacrylate.

Other suitable trifunctional acrylates include propoxylated glycerine triacrylate and propoxylated trimethylolpropane triacrylate.

Other higher functional acrylates include di-trimethylolpropane tetraacrylate, dipentaerythritol pentaacrylate, ethoxylated pentaerythritol tetraacrylate, methoxylated glycol acrylates and acrylate esters.

Furthermore, methacrylates corresponding to the above-mentioned acrylates may be used with these acrylates.

Examples of polymerisable oligomers include epoxy acrylates, aliphatic urethane acrylates, aromatic urethane acrylates, polyester acrylates and straight-chained acrylic oligomers.

Use of polymerisable substrates enables the formation of a negative photoresist in which the exposed portions or regions of the photoresist become insoluble to the photoresist developer via the polymerisation reaction of the transformable substrate. In the case of the cationic polymerisable substrate, there may also be a heating step after the exposure to UV light, the so called post exposure bake (PEB) to complete the polymerisation reaction. The unexposed and unpolymerised portion can be dissolved and removed by a suitable photoresist developer. After the step using the developer, a patterned coating which is insoluble in the developer remains on the surface. Depending on the application of the photoresist, for example as permanent coating such as a solder mask or dielectric layer, further steps may be carried out to harden the coating, such as a curing step which may be performed by the application of heat and/or additional exposure to UV light.

In the case of the application of heat, this may be achieved for example by heating on a hot plate or by baking in a static or conveyorised hot air circulating oven, or by using a conveyorised infra-red oven. In the case of additional exposure to light, this can be done for example by passing the substrate under a lamp emitting UV light of a wavelength or wavelengths suitable for initiating further free radical polymerisation using a conveyor.

In the case of a temporary resist such as an etch or plate resist, the additional curing step is not usually required since it would make later removal of the resist more difficult.

In another embodiment, the transformable substrate may be a protected polymer, for example a polymer having polar groups protected by acid labile groups, the polymer, after removal of the acid labile groups, being soluble in a developing medium. Examples of suitable polymers protected by acid labile groups are described in, for example U.S. Pat. No. 4,491,628 A, the contents of which are incorporated herein by reference, and include poly (tert-butyloxycarbonyloxy-☐-alkylstyrene), poly (p-tert-butyloxycarbonyloxy-☐-methylstyrene), poly (tert-butyloxycarbonyloxystyrene), poly (p-tert-butyloxycarbonyloxy-styrene) and poly (tert-butyl vinylbenzoate), poly (tert-butylmethacrylate), or copolymers thereof. In such examples, the acid labile groups are tert-butyl esters, of pendent carboxylic groups of the polymer or tert-butylcarbonates of pendent phenols of the polymer. Other examples of suitable polymers protected by acid labile groups are described in U.S. Pat. No. 7,858,287 B2, U.S. Pat. No. 9,529,259 B2 and U.S. Pat. No. 6,136,499 A, the contents of which are incorporated herein by reference.

This embodiment enables the formation of a positive photoresist in which the exposed portion of the photoresist becomes soluble to the photoresist developer via deprotection of the polymer, and can thus be removed by the developer, while the unexposed portions of the photoresist remain insoluble to the photoresist developer. After the step using the developer, a patterned coating which is insoluble in the developer remains on the surface. Further steps may be carried out to harden the coating, such as a curing step which may be performed by the application of heat. An example of an application of a positive photoresist is in high resolution lithography.

In another embodiment the transformable substrate may be a protected dissolution accelerator, for example a dissolution inhibitor containing acid-labile groups, which after acid catalysed hydrolytic reactions produce materials which are dissolution accelerators. Examples of dissolution inhibitors containing acid-labile groups and their use are given up in pp 223-227 of "Introduction to Microlithography ($2^{nd}$ edition) ISBN 0-8412-2848-5 and FIG. 85.

The composition may further comprise a quencher, also termed an acid diffusion controlling agent or a photodecomposable version thereof. Such compounds control diffusion, in a resist film, of an acid generated through exposure to light, thereby suppressing undesired chemical reaction in an unexposed area. The acid diffusion controlling agent may be a nitrogen-containing organic compound whose basicity does not change through light exposure or thermal treatment and is typically present in an amount of 0.005 to 5 wt. % of the composition. Examples of acid diffusion controlling agents are amines such as secondary lower aliphatic amines, tertiary lower aliphatic amines or the like such as: trimethylamine, diethylamine, di-n-propylamine, tri-n-propylamine, tripentylamine, diethanolamine, triethanolamine, quaternary ammonium compounds, trialkylammonium compounds amides, ureas, TBOC-blocked amines, and combinations of these and the like.

Examples of photodecomposable acid diffusion controlling agents include arylsulphonium or iodonium salts, containing anions, such as acetate, hydroxide, or sulphamate as well as those disclosed in U.S. Pat. No. 8,614,047 B2.

The composition may include further components known in the art such as crosslinking agents, colourants, inorganic mineral fillers, surface modifiers such as flow and debubbling agents, free radical scavengers, stabilisers, plasticisers and adhesion promoters.

More details of photoinitiated methods in which the compounds and compositions of the present invention may be used are described in WO 2011/086389 A1, the contents of which are hereby incorporated by reference in their entirety.

Further, the compounds and compositions may be used in the photosensitised chemically amplified resist (PSCAR) methods described in US2015241783 A1, US2016327869 A1, US2016357103 A1, "Photosensitised Chemically Amplified Resist™ (PSCAR™) 2.0 for high throughput and high resolution EUV lithography: Dual photosensitisation of acid generation and quencher decomposition by flood exposure", S. Tagawa et al., Proc. of SPIE Vol. 10146, Advances in Patterning Materials and Processes XXXIV, 101460G (2017), "Super High Sensitivity Enhancement by Photo-Sensitised Chemically Amplified Resist (PS-CAR) Process," S. Tagawa et al., J. Photopolymer Science and Technology, 26(6), 825 (2013), and "High-resist sensitisation by pattern and flood combination lithography," S. Nagahara et al., Proc. SPIE, 9048, 90481S (2014), all of which are incorporated by reference in their entirety for all purposes. The electromagnetic wave for patterning in the first stage can be EUV (13.5 nm), ArF (193 nm), KrF (248 nm) or electron beams for example. The electromagnetic radiation used in the second stage as flood radiation can be 365 nm, 375 nm, 385 nm, 395 nm, 405 nm, or 415 nm LEDs, or UV lamp which has wider wavelength distribution.

Synthesis of the Compounds of the Invention

The compounds of the invention of formula I may be synthesised by a variety of methods.

Compounds of formula I wherein the diol on one of the rings of a, for example, spiro[(1,3)dioxolane-2,9'-thioxanthene] structure is substituted by, for example, alkylhydroxy groups may be synthesised by first preparing the corresponding dihydroxyalkyl substituted 9H-thioxanthen-9-one compound protected as a diacetate which can be subsequently removed. The protected structure is then reacted with ethylene glycol in order to protect the carbonyl group with a 1,3 dioxolane group or 1,3-propylene glycol to protect the carbonyl with a 1,3-dioxane group, or 1,4-butanediol to protect the carbonyl group with a 1,3-dioxepane group, or 1,5-pentanediol to protect the carbonyl group with a 1,3-dioxocane group, or a 1,6-hexanediol to protect the carbonyl group with a 1,3-dioxonane group. Other glycols may also be used to produce substituted dioxolane, dioxane, dioxepane, dioxocane or dioxonane groups. The acetate protecting groups may then be removed to produce the, for example, dihydroxyalkyl substituted spiro[(1,3)dioxolane-2, 9'-thioxanthene]compounds.

The di-acetate protected compounds can be reacted with Lawessons reagent (2,4-Bis(4-methoxyphenyl)-1,3,2,4-dithiadiphosphetane-2,4-dithione) followed by reaction with a diol, for example phthalyl alcohol (benzene-1,2-dimethanol). This synthetic route is illustrated in the following specific reaction scheme:

Scheme 1

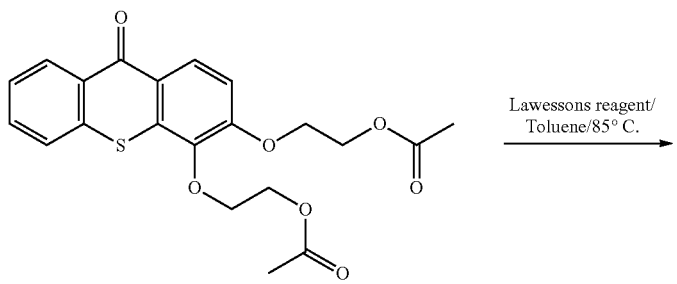

Lawessons reagent/
Toluene/85° C.

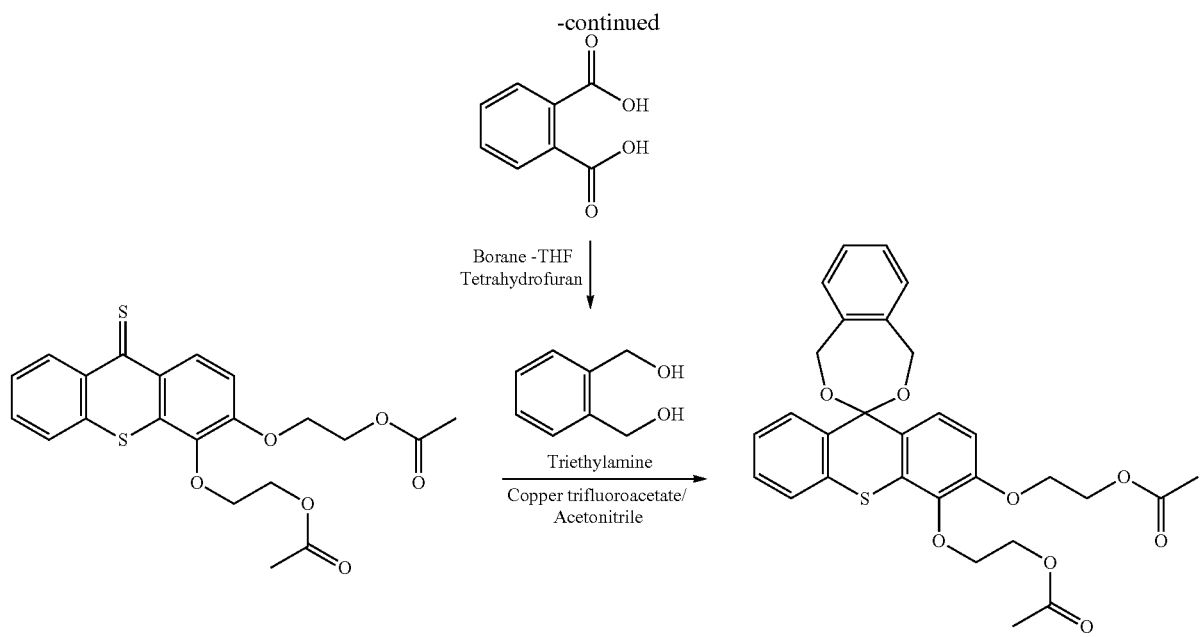
The hydroxyl or alkoxy substituted 9H-thioxanthen-9-one precursors may be made by the following synthetic routes:
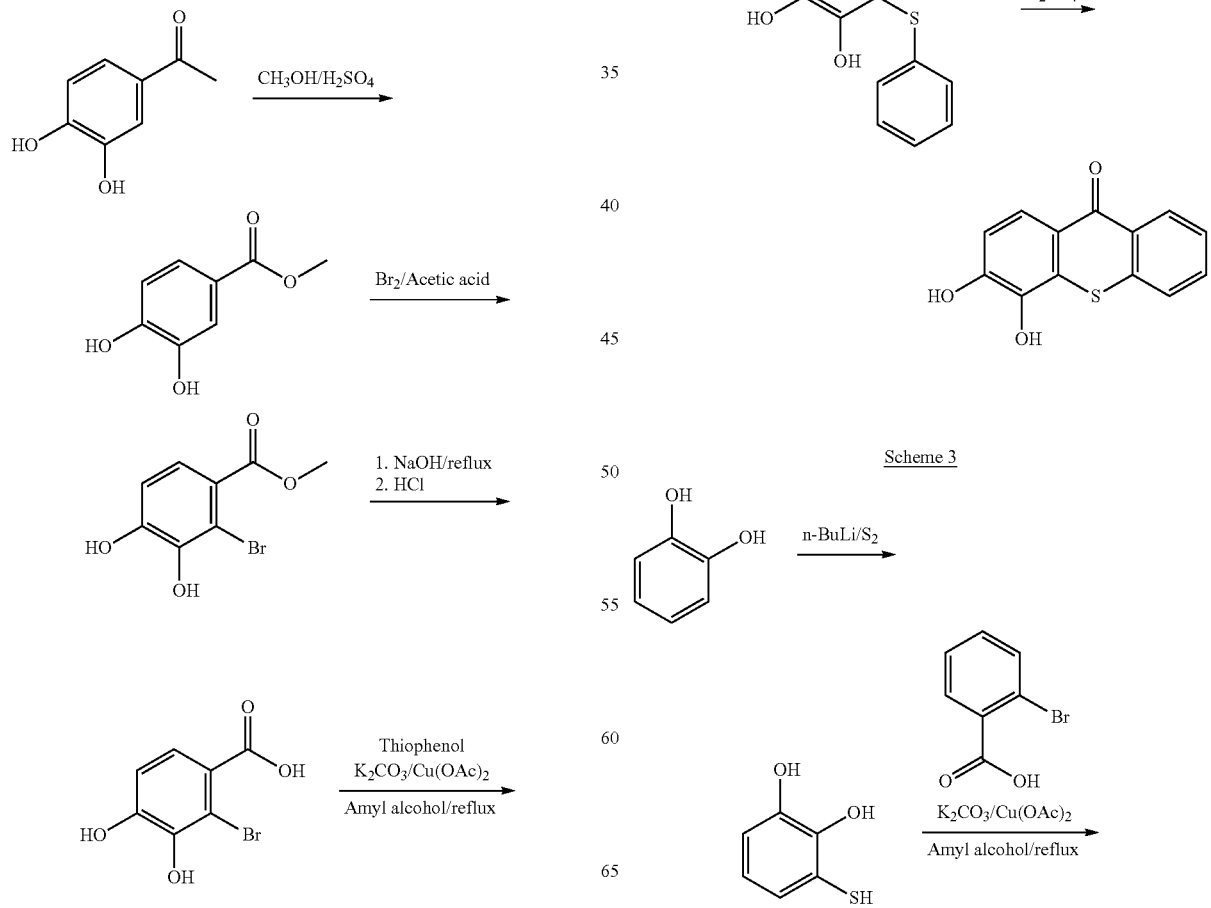

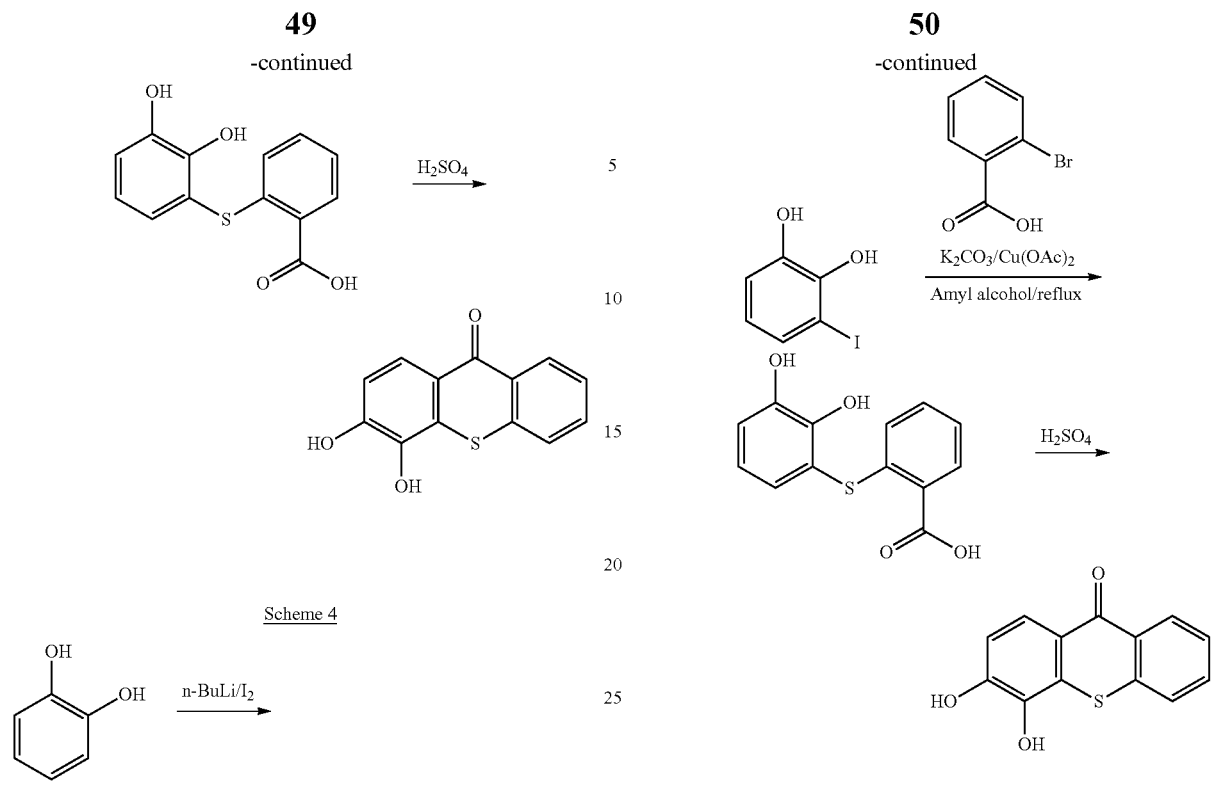
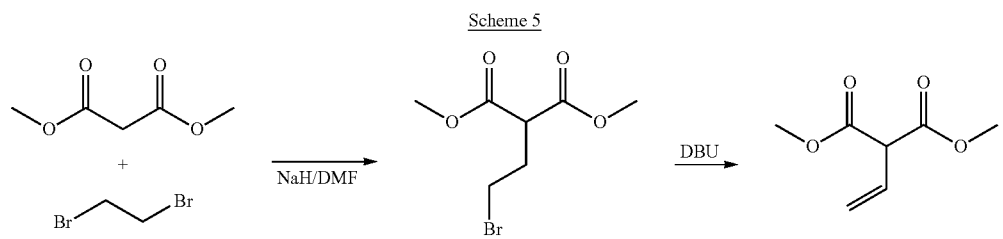
An example of a synthesis of a dimeric compound is provided below in Scheme 5:
Scheme 5
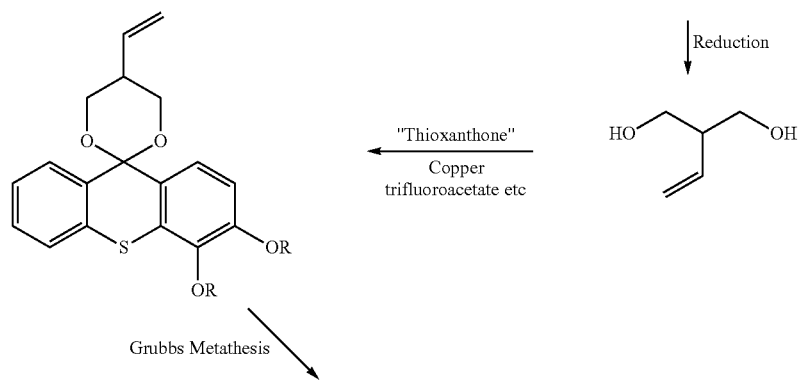

-continued

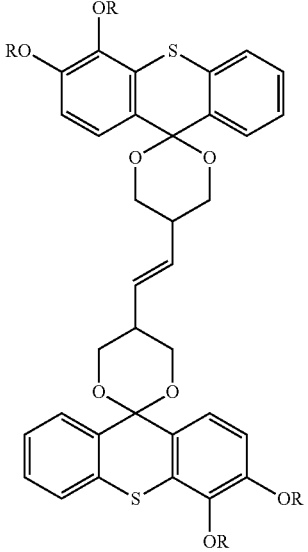

It is within the wherewithal of the person skilled in the art to modify any of the above described synthetic methods to synthesise any of the compounds within the scope of the present invention which have not explicitly been exemplified.

EXAMPLE OF THE INVENTION

The invention is illustrated by the following non-limiting examples.

Example 1

Synthesis of [(1,5-Dihydrospiro[benzo[e][1,3]dioxepine-3,9'-thioxanthen)-3',4'-diylbis(oxy)]bis(ethane-2,1-diyl)diacetate Stage I: [(9-)Oxo-9H-thioxanthene-3,4-diyl)bis(oxy)](ethane-2,1-diyl)diacetate Run 1

3,4-Dihydroxy-9H-thioxanthen-9-one (110 g, 0.45 mol) was dissolved in N,N-dimethylformamide (1500 ml), under a nitrogen atmosphere, to this was added anhydrous caesium carbonate (176 g). 2-Bromoethylacetate (165 g, 0.988 mol) was run into the solution via a dropping funnel and the mixture was stirred for 10 minutes. The reaction was heated to 70° C. (oil bath temperature) and stirred overnight. The solvent was removed on the rotary evaporator, and the residue was dissolved in saturated ammonium chloride solution (1000 ml). This was extracted with ethyl acetate (3×500 ml). The combined organic extracts were washed with brine (1000 ml) and then dried over sodium sulphate. The drying agent was removed by filtration and the filtrate was concentrated to leave a dark brown sticky solid, 192 g. This was triturated with methanol (500 ml), and the pale brown solid was collected by filtration, washed on the filter with methanol (100 ml), and then dried in the vacuum oven at 35° C. This gave a yield of 146 g, 0.351 mol, 78%.

LC/MS confirmed the structural weight with M+1=417.07, and a purity by HPLC of 96.02%. 1H NMR conformed to the desired structure.

Run 2+3

3,4-Dihydroxy-9H-thioxanthen-9-one (331 g, 1.355 mol) was dissolved in N,N-dimethylformamide (4600 ml), under a nitrogen atmosphere, to this was added anhydrous caesium carbonate (532 g, 1.633). 2-Bromoethylacetate (500 g, 2.994 mol) was run into the solution via a dropping funnel and the mixture was stirred for 10 minutes. The reactions were heated to 70° C. (oil bath temperature) and stirred overnight. The solvent was removed on the rotary evaporator, the two reactions being combined at this stage. The residue was dissolved in saturated ammonium chloride solution (3000 ml). This was extracted with ethyl acetate (4×2000 ml). The combined organic extracts were washed with water (3000 ml), an emulsion formed. This was filtered through a GF/F to remove some solid material. The combined organic extracts were washed with brine (3000 ml) and then dried over sodium sulphate. The drying agent was removed by filtration and the filtrate was concentrated to leave a dark brown sticky solid, 358 g. This was triturated with methanol (1000 ml), and the pale brown solid was collected by filtration, washed on the filter with methanol (100 ml), and then dried in the vacuum oven at 35° C. This gave a yield of 199.5 g, 41.5%.

LC/MS confirmed the structural weight with M+1=417.18, and a purity of by HPLC of 94.19%.

The solid removed by filtration earlier was slurried with dichloromethane (5000 ml), for 2 hours at room temperature. This was then filtered through a GF/F. The aqueous extract was re-extracted with dichloromethane (5000 ml), separated and combined with the dichloromethane filtrate. The organic extract was stirred over sodium sulphate for 1 hour then filtered. The filtrate was concentrated to a brown oily material, this was triturated with methanol (750 ml), for 1 hour, then the solid was collected by filtration. This was washed on the filter to leave a light tan solid. This was dried to give 152 g with a purity of 99.05% by HPLC. This gave a total yield of 351.5 g, 62.3%.

Run 4

3,4-Dihydroxy-9H-thioxanthen-9-one (130 g, 0.565 mol) was dissolved in N,N-dimethylformamide (1900 ml), under a nitrogen atmosphere, to this was added anhydrous caesium carbonate (221 g, 0.678). 2-Bromoethylacetate (209 g, 1.25 mol) was run into the solution via a dropping funnel and the mixture was stirred for 10 minutes. The reaction was heated to 70° C. (oil bath temperature) and stirred overnight. The solvent was removed on the rotary evaporator. The residue was dissolved in ethyl acetate (700 ml), and then added to saturated ammonium chloride solution (1400 ml). This was extracted with ethyl acetate (2×700 ml). The combined organic extracts were washed with water (3000 ml), an emulsion formed. This was filtered through a GF/F to remove some solid material. The combined organic extracts were washed with brine (1400 ml) and then dried over sodium sulphate. The drying agent was removed by filtration and the filtrate was concentrated to leave a dark brown sticky solid. This was triturated with methanol (700 ml), and the pale brown solid was collected by filtration, washed on the filter with methanol (3×100 ml), and then dried in the vacuum oven at 35° C. This gave a yield of 171 g, 72.7%.

LC/MS confirmed the structural weight with M+1=417.25, and a purity of by HPLC of 93.74%.

Stage II: [(9-)Thioxo-9H-thioxanthene-3,4-diyl bis(oxy)](ethane-2,1-diyl)diacetate Run 1

[(9-Oxo-9H-thioxanthene-3,4-diyl)bis(oxy)](ethane-2,1-diyl)diacetate (145 g, 0.351 mol) and Lawessons reagent (85 g, 0.211 mol) were suspended in toluene (1500 ml), under a nitrogen atmosphere. The pale brown suspension was heated at 85° C. for 3 hours, after which a dark green solution had formed, a TLC (1:1 hexane/ethyl acetate) showed the reaction to be complete. The reaction was cooled to room temperature and then poured into saturated sodium bicarbonate solution (2.2 lt). The two layers were separated, and the aqueous phase extracted with ethyl acetate (3×750 ml). The combined organic extracts were washed with brine (1000 ml), and dried over sodium sulphate and then filtered through a GF/F. The filtrate was concentrated to a dark green sticky solid. This was triturated with methanol (600 ml), and left to stand for 2 hours. The solid was collected by filtration and washed on the filter with methanol until the brown colour had gone. The dark green solid was air dried, this gave 137 g, 90.3%, with a HPLC purity of 89.45% (5.4% earlier peak possibly ketone, HPLC artefact). Mass spec. confirmed the molecular weight as M+1=433.16.

Run 2

[(9-Oxo-9H-thioxanthene-3,4-diyl)bis(oxy)](ethane-2,1-diyl)diacetate (249 g, 0.598 mol) and Lawessons reagent (146 g, 0.361 mol) were suspended in toluene (2600 ml), under a nitrogen atmosphere. The pale brown suspension was heated at 85° C. for 2 hours, after which a dark green solution had formed, a TLC (1:1 hexane/ethyl acetate) showed the reaction to be complete. The reaction was cooled to room temperature and then poured into saturated sodium bicarbonate solution (6 lt). The two layers were separated, and the aqueous phase extracted with ethyl acetate (3×1500 ml). The combined organic extracts were washed with brine (2000 ml), and dried over sodium sulphate and then filtered through a GF/F. The filtrate was concentrated to a dark green sticky solid. This was triturated with methanol (1000 ml), and left to stand for 24 hours. The solid was collected by filtration and washed on the filter with methanol until the brown colour had gone. The dark green solid was air dried, this gave 230 g, 88.9%, with a HPLC purity of 90.74% (4.79% earlier peak possibly ketone, HPLC artefact). Mass spec. confirmed the molecular weight as M+1=433.24.

Stage III: Benzene-1,2-dimethanol

Phthalic acid (450 g, 2.71 mol) was slurried in tetrahydrofuran (4000 ml) under nitrogen and cooled to 0-5° C. Add borane/tetrahydrofuran complex in tetrahydrofuran (7020 ml, 7.02 mol), then leave to stir and warm to room temperature overnight. Reaction was assessed as complete by TLC (toluene/ethyl acetate/formic acid, 5:4:1). The reaction was quenched by the drop wise addition of a 1:1 mixture of water and tetrahydrofuran (1630 ml), and then the aqueous layer was saturated with potassium carbonate (800 g). The mixture was stirred for 30 minutes and then separated. The aqueous phase was extracted with tetrahydrofuran (3×1600 ml), and the combined organic extracts were stirred over sodium sulphate for 1 hour. The drying agent was removed by filtration and the filtrate concentrated to a white crystalline sold, 366 g. This turned yellow overnight. The solid was slurried with hexane (1000 ml) for 1 hour, then collected by filtration, and washed on the filter with hexane (500 ml). The solid was pulled dry for 30 minutes then air dried. This gave a white crystalline solid, 333 g, 88.9%, purity by GC was 94.4%. The structure was confirmed by NMR.

The mass spec did not show a molecular ion but a dehydration fragment M+1=121 and loss of the $CH_2$ fragment as the main peak at M+1=93

Stage IIIa: [(1,5-Dihydrospiro[benzo[e][1,3]dioxepine-3,9'-thioxanthen]-3',4'-diylbis(oxy)]bis(ethane-2,1-diyl)diacetate

[(9-)Thioxo-9H-thioxanthene-3,4-diyl)bis(oxy)](ethane-2,1-diyl)diacetate (135 g, 0.312 mol) was suspended in acetonitrile (2700 ml), under a nitrogen atmosphere. To this was added benzene-1,2-dimethanol (65 g, 0.47 mol) and triethylamine (180 ml). The reaction mixture was warmed to 30° C. (oil bath temperature), and then a solution of copper trifluoroacetate (227.3 g, 0.785 mol) in acetonitrile (1000 ml) was added over several hours. The reaction was then warmed to 35° C. (oil bath temperature) for 3 days. TLC (4:1 hexane/ethyl acetate) showed completion of the reaction.

The solvent was removed on the rotary evaporator to leave a black residue. This was partitioned between brine (2000 ml) and ethyl acetate (2000 ml), and then filtered through celite on a GF/F to remove the copper salts. The filter cake was washed with ethyl acetate (1000 ml). The filtrate was separated and the aqueous layer was extracted with ethyl acetate (500 ml). The combined organic extracts were dried over sodium sulphate, filtered and concentrated to a thick brown oil (238 g). This was dispersed into isopropyl alcohol (3500 ml) under a nitrogen atmosphere. To this was added sodium borohydride (83 g, 2.19 mol), and the mixture was then heated at 65° C. (oil bath temperature) for 3 hours. A TLC (1:1 hexane/ethyl acetate) showed that all the ketone had been reduced.

The reaction mixture was cooled to room temperature, then poured into water (10 lt) and stirred. The product was extracted with dichloromethane (3×1500 ml), the combined organic extracts were washed with brine (2000 ml) and dried over sodium sulphate. The drying agent was removed by filtration through a GF/F and the filtrate concentrated to leave a viscous brown oil, 156 g, which crystallised overnight. This was dissolved in hexane/ethyl acetate (2:1) (250 ml) and passed through a basic (Brockmann grade 1) alumina column (1200 g), fractions containing the diacetate were concentrated, and then triturated with methanol. The solid was collected and dried to leave 2 g, DAS-22-74-1. NMR conformed to structure.

The column was then flushed off with methanol and the next product was collected and the fractions were concentrated to a thick orange oil, which crystallised overnight. This was triturated with methanol containing ~10% t-butyl methyl ether. The solid was collected and washed with methanol and t-butyl methyl ether, and then dried in vacuum oven at 35° C. overnight. This gave an off white solid, 29 g confirmed by 1H NMR to be the diol (hydrolysed during aqueous work up).

Compounds of the present invention have been found to deprotect and deblock in the presence of acid to reveal the thioxanthone photoinitator, thus rendering the compounds useful in the compositions and methods described herein.

While the compounds, methods and related aspects have been described with reference to certain examples, it will be appreciated that various modifications, changes, omissions, and substitutions can be made without departing from the spirit of the disclosure. The features of any dependent claim may be combined with the features of any of the other dependent claims or any and/or any of the independent claims.

The invention claimed is:

1. A compound of the Formula I:

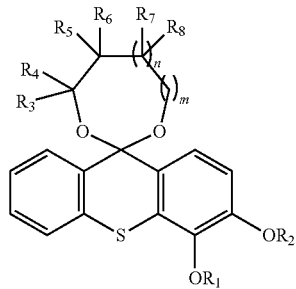

wherein:
n=0 or 1;
m=0, 1, 2 or 3;
$R_1$ and $R_2$ are independently selected from a $C_{1-6}$ alkylhydroxy group or a carboxylate ester thereof, a $C_{1-6}$ alkylthio group, a $C_{1-6}$ alkylamino group, and a $C_{1-6}$ carboxylate ester group wherein the ester portion comprises a $C_{1-6}$ alkyl group and/or a 4- to 10-membered carbocyclic group; and
$R_3$, $R_4$, $R_5$, $R_6$, $R_7$ and $R_8$ are independently selected from H, a hydroxy group, a $C_{1-6}$ alkyl group, a $C_{2-6}$ alkenyl group, a $C_{1-6}$ alkoxy group, a $C_{1-6}$ alkylthio group, a 4- to 8-membered carbocyclic group, a 4- to 8-membered heterocyclic group, and a $C_{1-6}$ carboxylate ester group wherein the ester portion comprises a $C_{1-6}$ alkyl group and/or a 4- to 10-membered carbocyclic group; or wherein $R_5$ forms with $R_3$ or an $R_7$ and the carbon atoms to which they are attached a 4- to 8-membered carbocyclic group or a 4- to 8-membered heterocyclic group.

2. The compound of Formula I according to claim 1, wherein $R_5$ forms with $R_3$ or an $R_7$, and the carbon atoms to which they are attached, a 6-membered carbocyclic group.

3. The compound of Formula I according to claim 1, wherein $R_1$ and $R_2$ are independently $C_{1-6}$ alkylhydroxy groups or carboxylate esters thereof.

4. A composition comprising:
(a) a compound of Formula (I) as defined in claim 1; and
(b) a chemically transformable substrate;
wherein the compound of Formula (I) is a precursor of a reactive derivative of Formula (III):

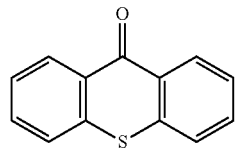

wherein:
one of the aromatic rings is di-substituted with substituents independently selected from —O—$C_{(1-6)}$alkylhydroxy group or a carboxylate ester thereof, a —O—$C_{(1-6)}$alkylthio group, a —O—$C_{(1-6)}$alkylamino group, and a —O—$C_{(1-6)}$carboxylate ester group wherein the ester portion comprises a $C_{1-6}$ alkyl group and/or a 4- to 10-membered carbocyclic group;
the compound being obtainable by reacting the compound of Formula (I) in the presence of an acid;
and further wherein the transformable substrate is capable of being transformed in the presence of the compound of Formula (III) by a direct photoinitiated reaction or an indirect photoinitiated reaction.

5. The composition according to claim 4, wherein the transformable substrate is a polymerisable substrate.

6. The composition according to claim 4, wherein the transformable substrate is a protected polymer.

7. The composition according to claim 4, further containing a photo acid generator (PAG).

8. The composition according to claim 4, further comprising a quencher.

9. A photoinitiated method comprising:
(a) forming a layer of a composition as claimed in claim 4 on a support;
(b) applying an acid, or generating an acid in situ, in selected regions of the layer and permitting the acid to react with the compound of Formula (I) and form the reactive derivative of Formula (III) in said selected regions of the layer;
(c) exposing the layer with the reactive derivative present in said selected regions to electromagnetic radiation of a wavelength or energy suitable to generate a reactive species from the compound of Formula (III); and
(d) permitting the reactive species directly or indirectly to cause transformation of the transformable substrate.

10. The method according to claim 9, wherein the composition comprises a PAG, and wherein in step (b), acid is generated in situ by exposing the layer to an external stimulus which causes the PAG to generate acid in said regions of the layer for reaction with the compound of Formula (I).

11. The method of claim 9, wherein the reactive species generated is a free radical, and the transformable substrate is a free radical promoted polymerisable substrate, whereby the free radical reactive species directly causes transformation of the transformable substrate.

12. The method of claim 9, wherein the composition further comprises a co-initiator or a synergist, and wherein the reactive species generated is an excited state of the compound of Formula (III) which is capable of functioning as a sensitiser to activate the co-initiator or synergist.

13. The method of claim 9, wherein the transformable substrate is a protected polymer having polar groups protected by acid labile groups, and wherein the reactive species generated is an excited state of the compound of Formula (III) which is capable of functioning as a sensitiser to activate the PAG whereby further acid is generated which is effective to transform the transformable substrate by deprotecting the protected polymer.

14. A photoresist structure comprising a substrate and a layer of the composition of claim 4 formed thereon.

15. A compound of Formula II:

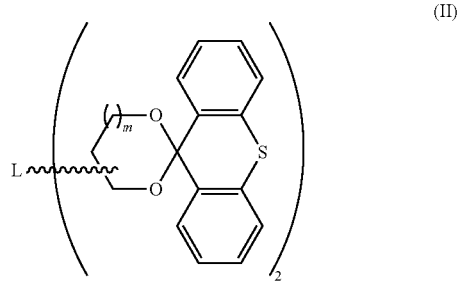

wherein:
m=0, 1, 2, 3 or 4; and
one of the aromatic rings is di-substituted, at the 3 and 4 positions of the thioxanthone ring, with substituents independently selected from —O—$C_{(1-6)}$alkylhydroxy group or a carboxylate ester thereof, a —O—$C_{(1-6)}$alkylthio group, a —O—$C_{(1-6)}$alkylamino group, and a —O—$C_{(1-6)}$carboxylate ester group wherein the ester portion comprises a $C_{1-6}$ alkyl group and/or a 4- to 10-membered carbocyclic group, wherein the 3 and 4 position substitution optionally produces a 5-membered benzodioxole ring; or
one or both of the aromatic rings is substituted with at least one substituent independently selected from hydroxy, alkoxy, benzyloxy, alkylcarbonate, hydroxyalkyl, acetal, ester, oxyacetic acid and esters thereof, aryloxy and arylthio; and
L=a linker group.

16. The compound of Formula II according to claim 15, wherein one of the aromatic rings is substituted with one, two, three or four substituents independently selected from hydroxy, alkoxy, benzyloxy, alkylcarbonate, hydroxyalkyl, acetal, ester, oxyacetic acid and esters thereof, aryloxy and arylthio.

17. The compound of Formula II according to claim 15, wherein the alkylcarbonate is a $C_{1-4}$ alkylcarbonate; the ester is a $C_{1-4}$ alkyl acid ester, or a cyclic orthoester; or the acetal is a $C_{1-4}$ alkoxyalkyl group or a cyclic acetal.

18. The compound of Formula II according to claim 15, wherein the compound of Formula II contains a blocked ketone monomer selected from:
3',4'-dimethoxyspiro[1,3-dioxane-2,9'-thioxanthene];
3',4'-dimethoxyspiro[1,3-dioxolane-2,9'-thioxanthene];
2',3'-dimethoxyspiro[(1.3)-dioxolane-2,9'-thioxanthene];
2'-methoxy-5,6-dimethyl-spiro[1,3-dioxepane-2,6'-thiochromeno [3,2-g][1,3]benzodioxole];
2'-methoxyspiro[1,3-dioxane-2,6'-thiochromeno [3,2-g][1,3]benzodioxole];
2'-methoxyspiro[1,3-dioxepane-2,6'-thiochromeno [2,3-g][1,3]benzodioxole];
2'-methoxy-5,5-dimethyl-spiro[1,3-dioxane-2,6'-thiochromeno [2,3-e][1,3]benzodioxole];
2'-methoxy-4,6-dimethyl-spiro[1,3-dioxepane-2,6'-thiochromeno [3,2-g][1,3]benzodioxole];
2'-methoxy-4,7-dimethyl-spiro[1,3-dioxepane-2,6'-thiochromeno [2,3-e][1,3]benzodioxole];
2'-methoxy-5,5-dimethyl-spiro[1,3-dioxepane-2,6'-thiochromeno [2,3-e][1,3]benzodioxole];
2'-methoxy-5-methyl-spiro[1,3-dioxepane-2,6'-thiochromeno [2,3-e][1,3]benzodioxole];
2'-ethoxyspiro[1,3-dioxepane-2,6'-thiochromeno [2,3-e][1,3]benzodioxole];
2'-propoxyspiro[1,3-dioxepane-2,6'-thiochromeno [3,2-g][1,3]benzodioxole];
2'-phenoxyspiro[1,3-dioxepane-2,6'-thiochromeno [2,3-e][1,3]benzodioxole];
2'-isopropoxyspiro[1,3-dioxepane-2,6'-thiochromeno [2,3-e][1,3]benzodioxole];
2'-ethoxyspiro[1,3-dioxane-2,6'-thiochromeno [3,2-g][1,3]benzodioxole];
2'-ethoxyspiro[1,3-dioxolane-2,6'-thiochromeno [2,3-e][1,3]benzodioxole];
2'-propoxyspiro[1,3-dioxane-2,6'-thiochromeno [3,2-g][1,3]benzodioxole];
2'-propoxyspiro[1,3-dioxolane-2,6'-thiochromeno [2,3-e][1,3]benzodioxole];
2'-isopropoxyspiro[1,3-dioxane-2,6'-thiochromeno [2,3-e][1,3]benzodioxole];
2'-isopropoxyspiro[1,3-dioxolane-2,6'-thiochromeno [3,2-g][1,3]benzodioxole];
2'-methoxyspiro[1,3-dioxane-2,6'-thiochromeno [2,3-e][1,3]benzodioxole];
2'-methoxyspiro[1,3-dioxolane-2,6'-thiochromeno [2,3-e][1,3]benzodioxole];
spiro[1,3-dioxolane-2,9'-thioxanthene]-3',4'-diol;
spiro[1,3-dioxane-2,9'-thioxanthene]-3',4'-diol;
spiro[1,3-dioxepane-2,9'-thioxanthene]-3',4'-diol;
5-methylspiro[1,3-dioxepane-2,9'-thioxanthene]-3',4'-diol;
5,5-dimethylspiro[1,3-dioxepane-2,9'-thioxanthene]-3',4'-diol;
3',4'-dimethoxy-4,6-dimethyl-spiro[1,3-dioxane-2,9'-thioxanthene]; or
3',4'-dimethoxy-4,5-dimethyl-spiro[1,3-dioxolane-2,9'-thioxanthene].

19. The compound of Formula II according to claim 15, wherein L is selected from the group consisting of a single bond, a $C_{1-6}$ alkyl group, a $C_{2-6}$ alkenyl group, or a 4- to 8-membered carbocyclic group, each of which may be substituted, or wherein L comprises a fused carbon-carbon bond shared between the respective 1,3-dioxolane groups, 1,3 dioxane groups, 1,3-dioxepane groups, 1,3-dioxocane groups or 1,3-dioxonane groups, or wherein L comprises a carbon atom shared between the respective 1,3-dioxolane groups, 1,3 dioxane groups, 1,3-dioxepane groups, 1,3-dioxocane groups, or 1,3-dioxonane groups.

20. The compound of Formula II according to claim 15: wherein one or both of the aromatic rings is substituted with at least one substituent independently selected from alkylcarbonate, ester, and acetal, wherein:
the alkylcarbonate is t-butoxycarbonate;
the ester is acetic acid ester, a methylorthoformate ester, an ethylorthoformate ester, an n-propylorthoformate ester, or an isopropylorthoformate ester; or
the acetal is ethoxyethyl; or
wherein one or both of the aromatic rings is substituted with at least one substituent independently selected from hydroxy, alkoxy, or combinations thereof.

21. A composition comprising:
(c) a compound of Formula (II) as defined in claim 15; and
(d) a chemically transformable substrate;

wherein the compound of Formula (II) is a precursor of a reactive derivative of Formula (III):

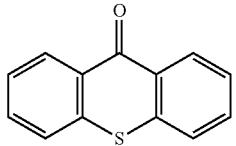
(III)

wherein:
one or both of the aromatic rings is substituted with at least one substituent independently selected from hydroxy, alkoxy, benzyloxy, alkylcarbonate, hydroxyalkyl, acetal, ester, oxyacetic acid and esters thereof, aryloxy and arylthio;
the compound being obtainable by reacting the compound of Formula (II) in the presence of an acid;
and further wherein the transformable substrate is capable of being transformed in the presence of the compound of Formula (III) by a direct photoinitiated reaction or an indirect photoinitiated reaction.

22. The composition according to claim 21, wherein the transformable substrate is a polymerisable substrate.

23. The composition according to claim 21, wherein the transformable substrate is a protected polymer having polar groups protected by acid labile groups, the polymer, after removal of the acid labile groups, being soluble in a developing medium.

24. The composition according to claim 21, further containing a photo acid generator (PAG), wherein the PAG is capable of being photosensitised by the compound of Formula (III).

25. The composition according to claim 21, further comprising a quencher.

26. A photoinitiated method comprising:
(e) forming a layer of a composition as claimed in claim 21 on a support;
(f) applying an acid, or generating an acid in situ, in selected regions of the layer and permitting the acid to react with the compound of Formula (II) and form the reactive derivative of Formula (III) in said selected regions of the layer;
(g) exposing the layer with the reactive derivative present in said selected regions to electromagnetic radiation of a wavelength or energy suitable to generate a reactive species from the compound of Formula (III); and
(h) permitting the reactive species directly or indirectly to cause transformation of the transformable substrate.

27. The method according to claim 26, wherein the composition comprises a PAG, and wherein in step (b), acid is generated in situ by exposing the layer to an external stimulus which causes the PAG to generate acid in said regions of the layer for reaction with the compound of Formula (II).

28. The method of claim 26, wherein the reactive species generated is a free radical, and the transformable substrate is a free radical promoted polymerisable substrate, whereby the free radical reactive species directly causes transformation of the transformable substrate.

29. The method of claim 26, wherein the composition further comprises a co-initiator or a synergist, and wherein the reactive species generated is an excited state of the compound of Formula (III) which is capable of functioning as a sensitiser to activate the co-initiator or synergist.

30. The method of claim 26, wherein the transformable substrate is a protected polymer having polar groups protected by acid labile groups, and wherein the reactive species generated is an excited state of the compound of Formula (III) which is capable of functioning as a sensitiser to activate the PAG whereby further acid is generated which is effective to transform the transformable substrate by deprotecting the protected polymer.

31. A photoresist structure comprising a substrate and a layer of the composition of claim 21 formed thereon.

32. A compound selected from:
2-[4'-(2-acetoxyethoxy)spiro[1,5-dihydro-2,4-benzodioxepine-3,9'-thioxanthene]-3'-yl]oxyethyl acetate;
2-[4'-(2-hydroxyethoxy)spiro[1,5-dihydro-2,4-benzodioxepine-3,9'-thioxanthene]-3'-yl]oxyethanol;
2-[4'-(2-acetoxyethoxy)-5-phenyl-spiro[1,3-dioxane-2,9'-thioxanthene]-3'-yl]oxyethyl acetate;
2-[4'-(2-hydroxyethoxy)-5-phenyl-spiro[1,3-dioxane-2,9'-thioxanthene]-3'-yl]oxyethanol;
2-[4'-(2-acetoxyethoxy)-5,5-dimethyl-spiro[1,3-dioxane-2,9'-thioxanthene]-3'-yl]oxyethyl acetate;
2-[4'-(2-hydroxyethoxy)-5,5-dimethyl-spiro[1,3-dioxane-2,9'-thioxanthene]-3'-yl]oxyethanol;
2-[4'-(2-acetoxyethoxy)spiro[1,3-dioxepane-2,9'-thioxanthene]-3'-yl]oxyethyl acetate;
2-[4'-(2-hydroxyethoxy)spiro[1,3-dioxepane-2,9'-thioxanthene]-3'-yl]oxyethanol;
2-[4'-(2-acetoxyethoxy)spiro[1,3-dioxane-2,9'-thioxanthene]-3'-yl]oxyethyl acetate;
2-[4'-(2-hydroxyethoxy)spiro[1,3-dioxane-2,9'-thioxanthene]-3'-yl]oxyethanol;
2-[4'-(2-acetoxyethoxy)-5-[4-[3',4'-bis(2-acetoxyethoxy)spiro[1,3-dioxane-2,9'-thioxanthene]-5-yl]phenyl]spiro[1,3-dioxane-2,9'-thioxanthene]-3'-yl]oxyethyl acetate;
2-[5-[4-[3',4'-bis(2-hydroxyethoxy)spiro[1,3-dioxane-2,9'-thioxanthene]-5-yl]phenyl]-4'-(2-hydroxyethoxy)spiro[1,3-dioxane-2,9'-thioxanthene]-3'-yl]oxyethanol;
2-{3'-[2-(acetyloxy) ethoxy]-5-{4'-[2-(acetyloxy) ethoxy]-3'-{2-[(1-hydroxyethenyl)oxy]ethoxy}spiro[1,3-dioxane-2,9'-thioxanthen]5-yl}spiro[1,3-dioxane-2,9'-thioxanthen]-4'yloxy}ethyl acetate;
2-{5'-[3',4'-bis(2-hydroxyethoxy)spiro[1,3-dioxane-2,9'thioxanthen]-5-yl]-3'-(2-hydroxyethoxy)spiro[1,3-dioxane-2,9'thioxanthen]-4'-yloxy}ethan-1-ol;
2-{3,4'''-bis[2-(acetyloxy) ethoxy]-3'''-{2-[(1-hydroxyethenyl)oxy]ethoxy}trispiro[thioxanthene-9,2':5'm5''-bis([1,3]dioxane)-2'',9'''-thioxanthen]4-yloxy}ethyl acetate;
2-[3,3''',4''''-tris(2-hydroxyethoxy) trispiro[thioxanthene-9,2': 5',5''-bis([1,3]dioxane)-2'',9'''-thioxanthen]-4-yloxy]ethan-1-ol;
2-{3'-[2-acetyloxy) ethoxy]-5-{4'-[2-(acetyloxy) ethoxy]-3'-{2-[(1-hydroxyethenyl)oxy]ethoxy}spiro[1,3-dioxane-2,9'thioxanthen]-5-yl}spiro[1,3-dioxane-2,9'-thioxanthen]-4'yloxy}ethyl acetate;
2-{5-[3',4'-bis(2-hydroxyethoxy)spiro[1,3-dioxane-2,9'-thioxanthen]-5-yl]-3'-(2-hydroxyethoxy)spiro[1,3-dioxane-2,9'thioxanthen]4'-yloxy}ethan-1-ol;
2-{3'',4'',6-tris[2-acetyloxy) ethoxy]-1',5',5'a,6',10',10'a-hexahydrospiro[thioxanthene-9,8'-[2,4,7,9]tetraoxaheptalene-3',9''thioxanthen]-5-yloxy}ethyl acetate;
2-[3'',4'',6-tris(2-hydroxyethoxy)-1',5',5'a,6',10',10'a-hexahydrodispiro[thioxanthene-9,8'-[2,4,7,9]tetraoxaheptalene-3',9''-thioxanthen]5-yloxy]ethan-1-ol;

2-[4'-(2-acetoxyethoxy)-5-[2-[3',4'-bis(2-acetoxyethoxy) spiro[1,3-dioxane-2,9'-thioxanthene]-5-yl]ethyl]spiro [1,3-dioxane-2,9'-thioxanthene]-3'-yl]oxyethyl acetate;

2-[5-[2-[3',4'-bis(2-hydroxyethoxy)spiro[1,3-dioxane-2, 9'-thioxanthene]-5-yl]ethyl]-4'-(2-hydroxyethoxy) spiro[1,3-dioxane-2,9'-thioxanthene]-3'-yl]oxyethanol; or 5-[2-(3',4'-dimethoxyspiro[1,3-dioxane-2,9'-thioxanthene]-5-yl) ethyl]-3',4'-dimethoxy-spiro[1,3-dioxane-2,9'-thioxanthene].

* * * * *